United States Patent
Liu

(10) Patent No.: US 7,821,810 B2
(45) Date of Patent: Oct. 26, 2010

(54) PHASE CHANGE MEMORY ADAPTIVE PROGRAMMING

(75) Inventor: Jun Liu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 195 days.

(21) Appl. No.: 12/049,072

(22) Filed: Mar. 14, 2008

(65) Prior Publication Data

US 2009/0231912 A1 Sep. 17, 2009

(51) Int. Cl.
*G11C 11/00* (2006.01)

(52) U.S. Cl. ............................ 365/148; 365/189.16

(58) Field of Classification Search ............. 365/148, 365/189.16
See application file for complete search history.

(56) References Cited

U.S. PATENT DOCUMENTS

| | | | |
|---|---|---|---|
| 6,487,113 | B1 | 11/2002 | Park et al. |
| 6,671,710 | B2 | 12/2003 | Ovshinsky et al. |
| 7,106,622 | B2 | 9/2006 | Nangle |
| 7,236,393 | B2 | 6/2007 | Cho et al. |
| 7,254,056 | B2 | 8/2007 | Nangle |
| 2003/0002331 | A1 | 1/2003 | Park et al. |
| 2003/0128568 | A1 | 7/2003 | Nangle |
| 2006/0087877 | A1 | 4/2006 | Cho |
| 2006/0268603 | A1 | 11/2006 | Nangle |
| 2007/0047296 | A1* | 3/2007 | Philipp et al. ............... 365/163 |
| 2007/0153570 | A1 | 7/2007 | Suh |
| 2007/0206410 | A1* | 9/2007 | Sutardja ..................... 365/163 |
| 2008/0316792 | A1* | 12/2008 | Philipp ....................... 365/148 |

FOREIGN PATENT DOCUMENTS

WO  WO-2009114200 A1  9/2009

OTHER PUBLICATIONS

"International Application Serial No. PCT/US2009/001638, Search Report mailed Jul. 2, 2009".
"International Application Serial No. PCT/US2009/001638, Written Opinion mailed Jul. 2, 2009".

* cited by examiner

*Primary Examiner*—Hoai V Ho
(74) *Attorney, Agent, or Firm*—Schwegman, Lundberg & Woessner, P.A.

(57) ABSTRACT

Some embodiments include methods and apparatus having a module configured to program a memory cell using a signal to cause the memory cell to have a programmed resistance value, to adjust a programming parameter value of the signal if the programmed resistance value is outside a target resistance value range, and to repeat at least one of the programming and the adjusting if the programmed resistance value is outside the target resistance value range, the signal including a different programming parameter value each time the programming is repeated.

12 Claims, 23 Drawing Sheets

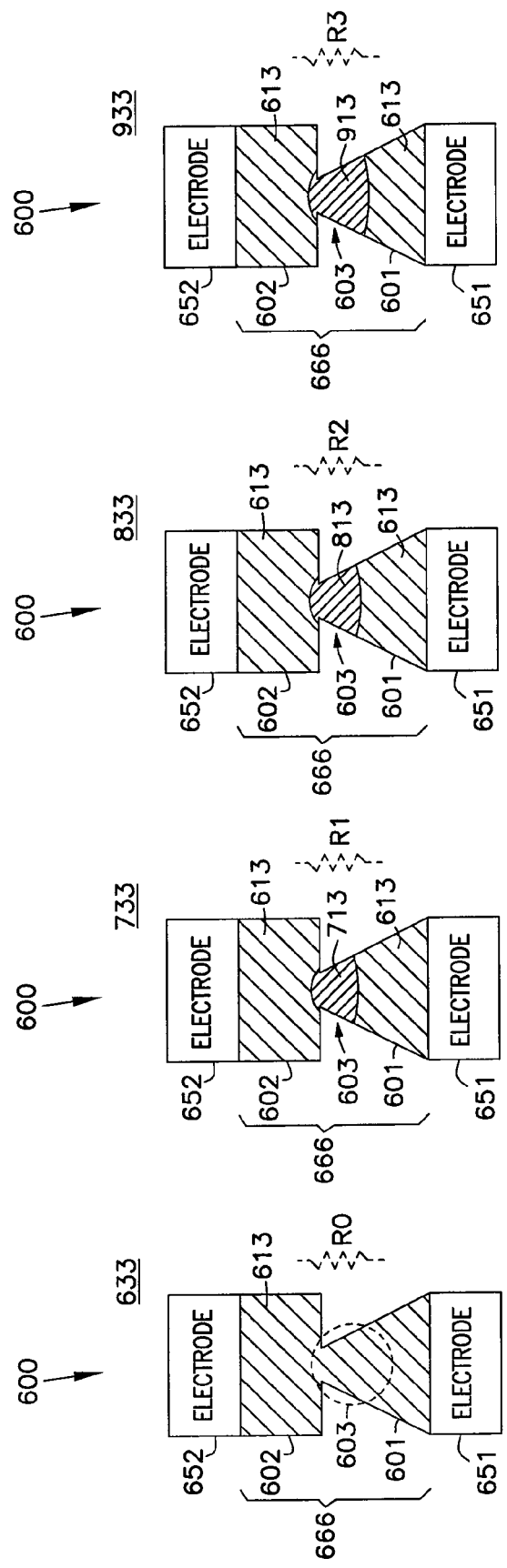

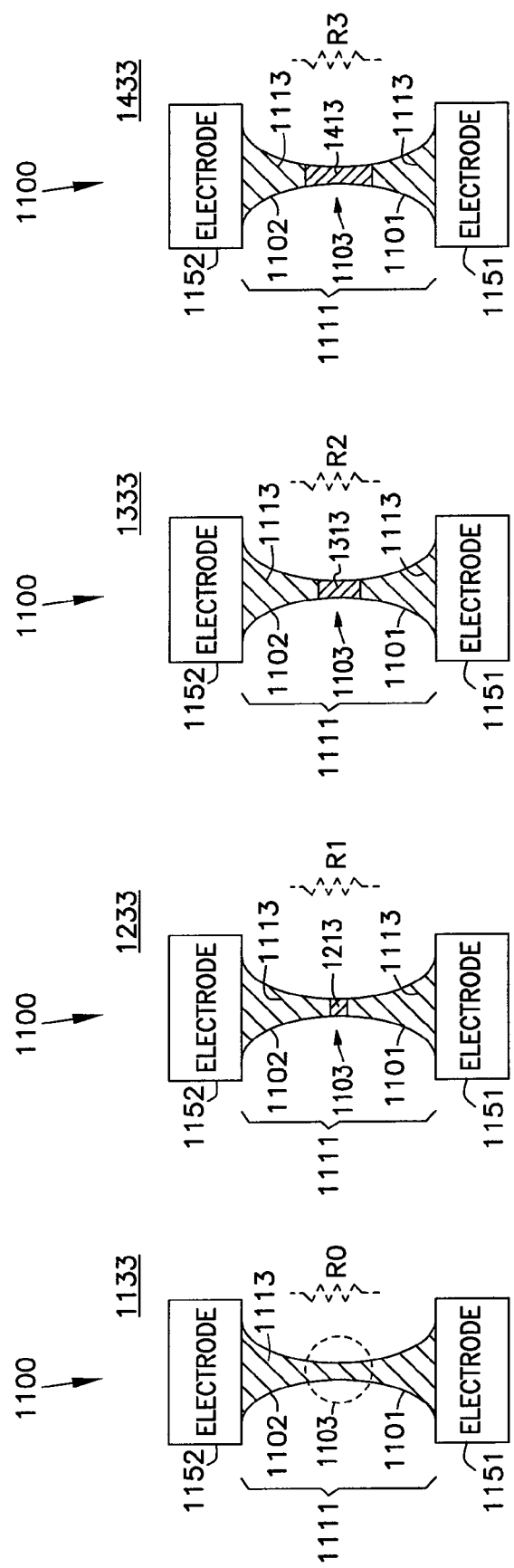

3100

| RESISTANCE VALUE | CURRENT VALUE | INFORMATION VALUE |
|---|---|---|
| R0 | $I_{SET}$ | 00 |
| Ra | Ia | |
| R1 | $I_{RESET1}$ | 01 |
| Rb | Ib | |
| R2 | $I_{RESET2}$ | 10 |
| Rc | Ic | |
| R3 | $I_{RESET3}$ | 11 |
| Rd | Id | |

3200

| RESISTANCE VALUE | TRANSITION TIME VALUE | INFORMATION VALUE |
|---|---|---|
| R0 | $T_0$ | 00 |
| Ra | Ta | |
| R1 | $T_1$ | 01 |
| Rb | Tb | |
| R2 | $T_2$ | 10 |
| Rc | Tc | |
| R3 | $T_3$ | 11 |
| Rd | Td | |

PHASE CHANGE MEMORY ADAPTIVE PROGRAMMING

BACKGROUND

Computers and other electronic products, e.g., digital televisions, digital cameras, and cellular phones, often have a memory device to store data and other information. Some conventional memory devices may store information based on the amount of charges on a storage node of the memory cell. The storage node is usually made of semiconductor material such as silicon. Different values of the charge on the storage node may represent different values (e.g., binary values "0" and "1") of a bit of information stored in the memory cell.

Other conventional memory devices (e.g., phase change memory devices) may store information based on a resistance state of a memory element of the memory cell. The memory element may have a material that can change between different phases (e.g., crystalline and amorphous phases) when programmed. Different phases of the material may cause the memory cell to have different resistance states with different resistance values. The different resistance states of a memory element may represent different values of the information stored in the memory.

In some phase change memory devices, configuring the memory cells to increase data storage density or programming the memory cells to meet some device performance specifications may pose a challenge.

BRIEF DESCRIPTION OF THE DRAWINGS

FIG. 6 through FIG. 9 show a memory cell having a memory element with a structure configured to have various resistance states corresponding to various resistance values according to various embodiments of the invention.

FIG. 11 through FIG. 14 show another memory cell having a memory element with another structure configured to have various resistance states corresponding to various resistance values according to various embodiments of the invention.

DETAILED DESCRIPTION

Figure 1:
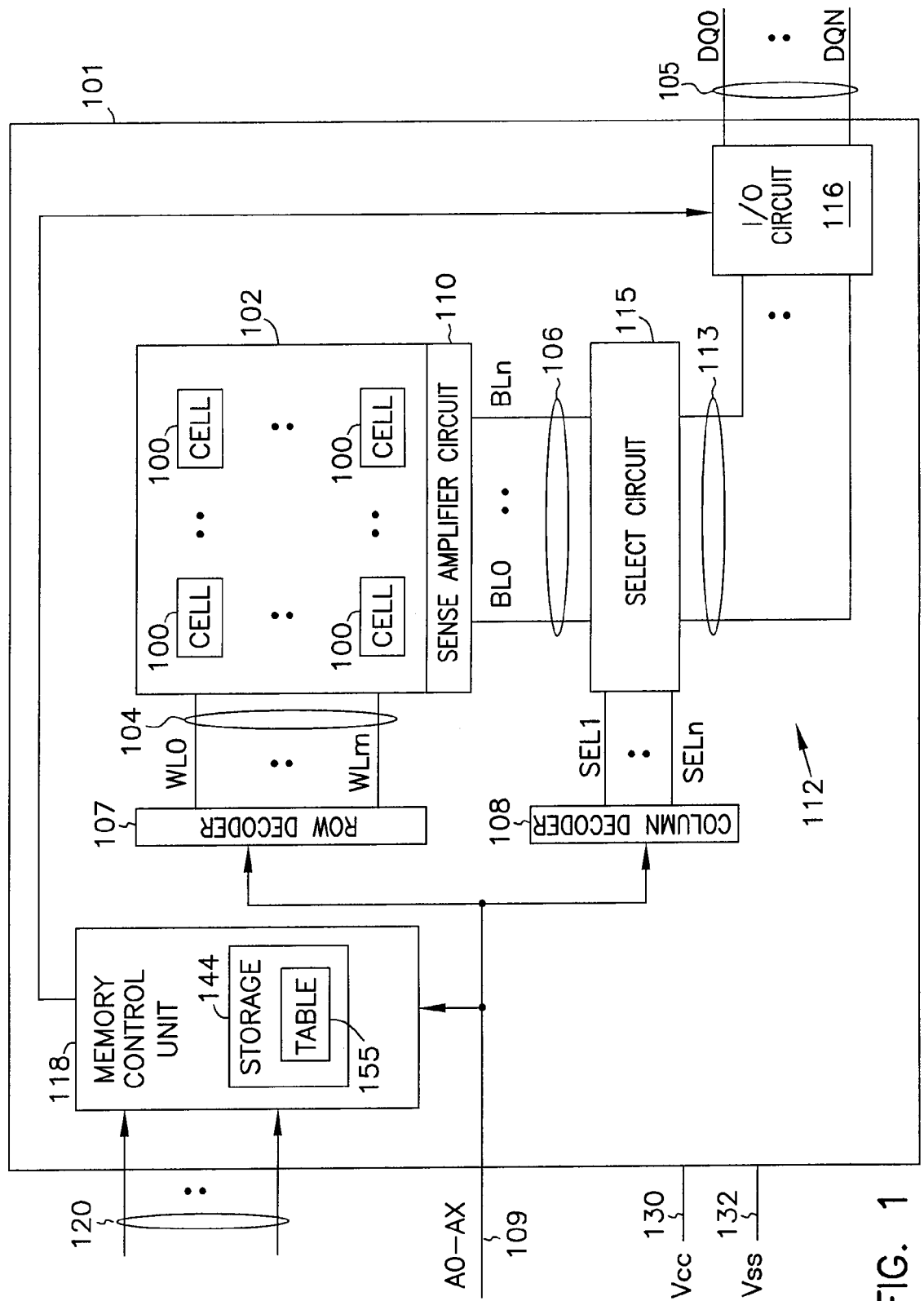
FIG. 1 shows a block diagram of a memory device having a memory array with phase change memory cells according to an embodiment of the invention.

FIG. 1 shows a block diagram of a memory device 101 having a memory array 102 with phase change memory cells 100 according to an embodiment of the invention. Memory cells 100 may be arranged in rows and columns along with lines 104 (e.g., wordlines having signals WL0 through WLm) and lines 106 (e.g., bit lines having signals BL0 through BLn). Memory device 101 may use lines 104 and lines 106 to transfer information with memory cells 100. Row decoder 107 and column decoder 108 may decode address signals A0 through AX on lines 109 (e.g., address lines) to determine which memory cells 100 are to be accessed. A sense amplifier circuit 110 may operate to determine the value of information read from memory cells 100 and provide the information in the form of signals to lines 106. Sense amplifier circuit 110 may also use the signals on lines 106 to determine the value of information to be written to memory cells 100. Memory device 101 may include circuitry 112 to transfer information between memory array 102 and lines (e.g., data lines) 105. Signals DQ0 through DQN on lines 105 may represent information read from or written into memory cells 100. Lines 105 may include nodes within memory device 101 or pins (or solder balls) on a package where memory device 101 may reside. Other devices external to memory device 101 (e.g., a memory controller or a processor) may communicate with memory device 101 through lines 105, 109, and 120.

Memory device 101 may perform memory operations such as a read operation to read information from memory cells 100 and a programming operation (sometime referred to as write operation) to program (e.g., write) information into memory cells 100. A memory control unit 118 may control the memory operations based on control signals on lines 120. Examples of the control signals on lines 120 may include one or more clock signals and other signals to indicate which operation, (e.g., a programming or read operation) memory device 101 may perform. Other devices external to memory device 101 (e.g., a processor or a memory controller) may control the values of the control signals on lines 120. Specific values of a combination of the signals on lines 120 may produce a command (e.g., programming or read command) that may cause memory device 101 to perform a corresponding memory operation (e.g., programming or read operation).

Each of memory cells 100 may be programmed to store information representing a value of a single bit or a value of multiple bits such as two, three, four, or another number of bits. For example, each of memory cells 100 may be programmed to store information representing a binary value "0" or "1" of a single bit. In another example, each of memory cells 100 may be programmed to store information representing a value of multiple bits, such as one of four possible values "00", "01", "10", and "11" of two bits, one of eight possible values "000", "001", "010", "011", "100", "101", "110" and "111", or one of other values of another number of multiple bits.

Memory device 101 may receive a supply voltage, including supply voltage signals Vcc and Vss, on lines 130 and 132, respectively. Supply voltage signal Vss may operate at a ground potential (e.g., having a value of approximately zero volts). Supply voltage signal Vcc may include an external voltage supplied to memory device 101 from an external power source such as a battery or an alternating-current to direct-current (AC-DC) converter circuitry.

Circuitry 112 of memory device 101 may include a select circuit 115 and an input/output (I/O) circuit 116. Select circuit 115 may respond to signals SEL1 through SELn to select the signals on lines 106 and 113 that may represent the information read from or programmed into memory cells 100. Column decoder 108 may selectively activate the SEL1 through SELn signals based on the A0 through AX address signals on lines 109. Select circuit 115 may select the signals on lines 106 and 113 to provide communication between memory array 102 and I/O circuit 116 during read and programming operations.

Memory device 101 may include a non-volatile memory device and memory cells 100 may include non-volatile memory cells such that memory cells 100 may retain information stored thereon when power (e.g., Vcc or Vss, or both) is disconnected from memory device 101. For example, memory device 101 may include a phase change memory device such that each of memory cells 100 may include a memory element having a material in which at least a portion (e.g., programmable portion) of the material may be programmed to cause the portion to change between different phases, such as between a crystalline phase (which is sometimes referred to as a crystalline state) and an amorphous phase (which is sometimes referred to as an amorphous state). Each of memory cells 100 may have a resistance state corresponding to a resistance value when the memory cell is programmed. Different resistance values may represent different values of information programmed in each of memory cells 100.

Memory device 101 may perform a programming operation when it receives (e.g. from an external processor or a memory controller) a programming command and value of information to be programmed into one or more of selected memory cells among memory cells 100. Based on the value of the information, memory device 101 may program the selected memory cells to cause them to have appropriate resistance values to represent the values of the information.

Memory device 101 may include a storage area 144 to store programming parameter values and selectively use these values during a programming operation. Memory device 101 may store the programming parameter values in the form of a table 155 in storage area 144. The programming parameter values may include amplitude value, transition time value, or both, of a pulse of the signal that memory device 101 may use in a programming operation. The amplitude value may correspond to current amplitude value (e.g., in ampere unit) of the pulse or voltage amplitude value (e.g., in volt unit) of the pulse to be used in a programming operation. The transition time value may correspond to a rise time (in time unit such as nanosecond) of a rising edge or a fall time (in time unit such as nanosecond) of a falling edge of the pulse to be used in a programming operation. The programming parameter values may also include offset values that memory device 101 may use to determine an acceptable range for a target resistance value to be programmed into a memory cell.

One skilled in the art may recognize that memory device 101 may include other components that are not shown to help focus on the embodiments described herein.

Memory device 101 may include devices, memory cells, and programming operations similar to or identical to those described below with reference to FIG. 2 through FIG. 34.

Figure 2:
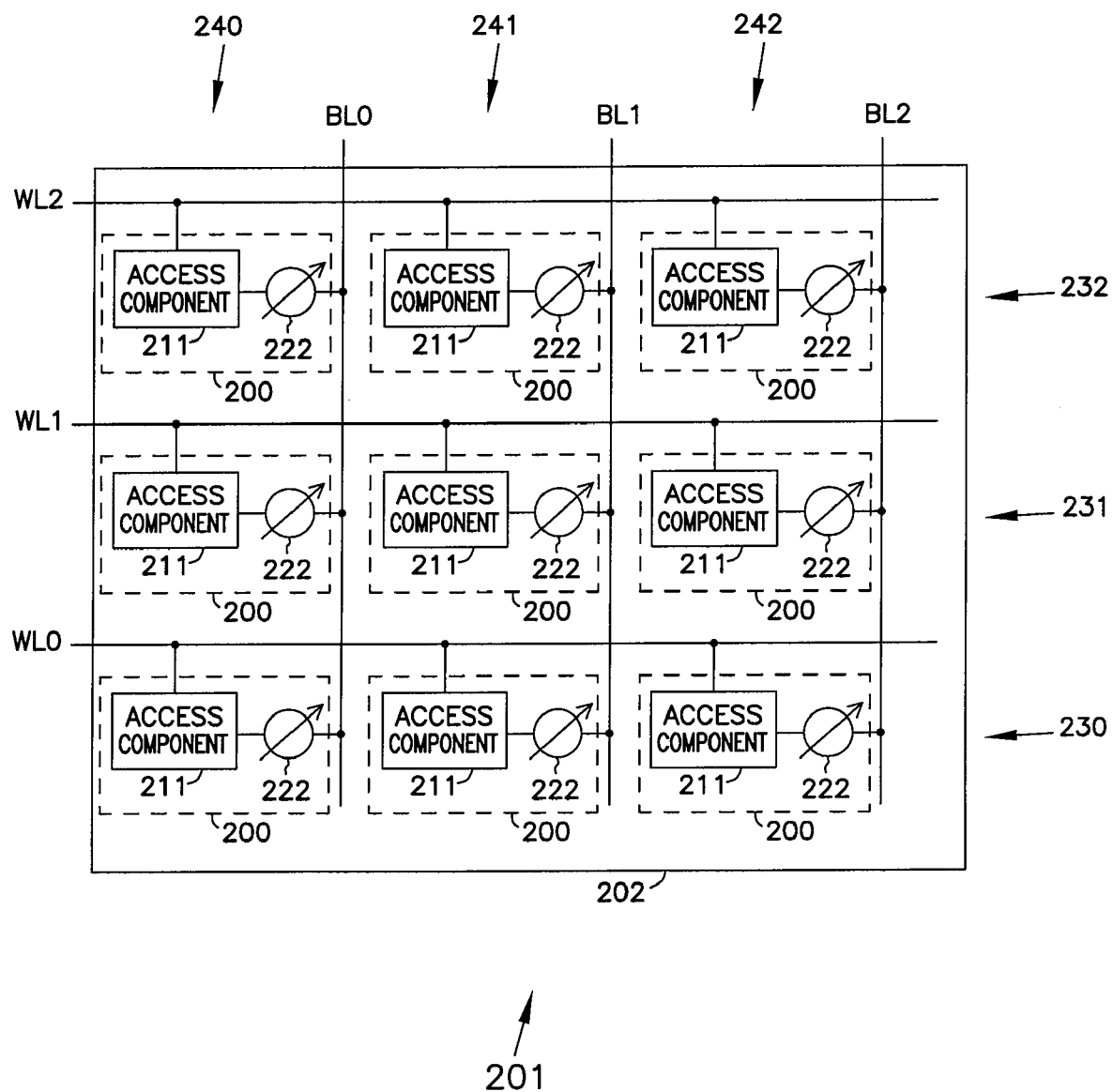
FIG. 2 show a partial block diagram of a memory device having a memory array including phase change memory cells with access components and memory elements according to an embodiment of the invention.

FIG. 2 show a partial block diagram of a memory device 201 having a memory array 202 including phase change memory cells 200 with access components 211 and memory elements 222 according to an embodiment of the invention. Memory array 202 may correspond to memory array 102 of FIG. 1. As shown in FIG. 2, memory cells 200 may be arranged in rows 230, 231, and 232 along with lines having signals WL0, WL1, and WL2, and columns 240, 241, and 242 along with lines having signals BL0, BL1, and BL2. Access components 211 may turn on (e.g., by using appropriate values of signals WL0, WL1, and WL2) to allow access to memory elements 222 to read information (e.g., measure a resistance value) from memory elements 222 or program information into memory elements 222 (e.g., causing memory elements 222 to have specific resistance value).

Figure 3:
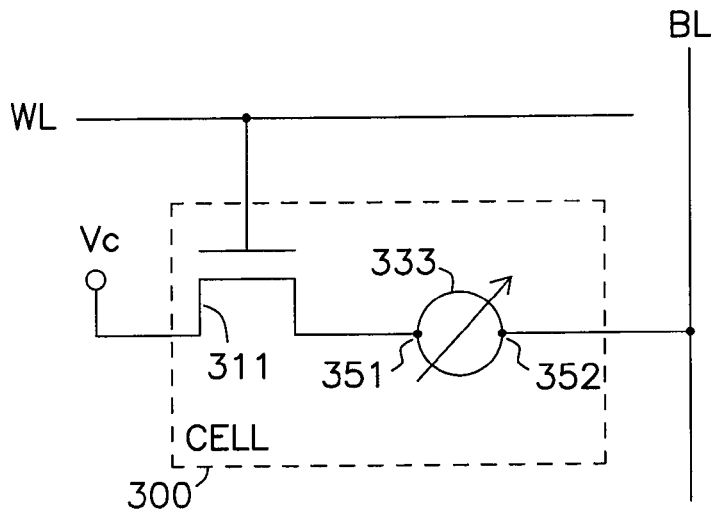
FIG. 3 through FIG. 5 show schematic diagrams of examples of different memory cells having different access components coupled to memory elements according to various embodiments of the invention.
Figure 4:
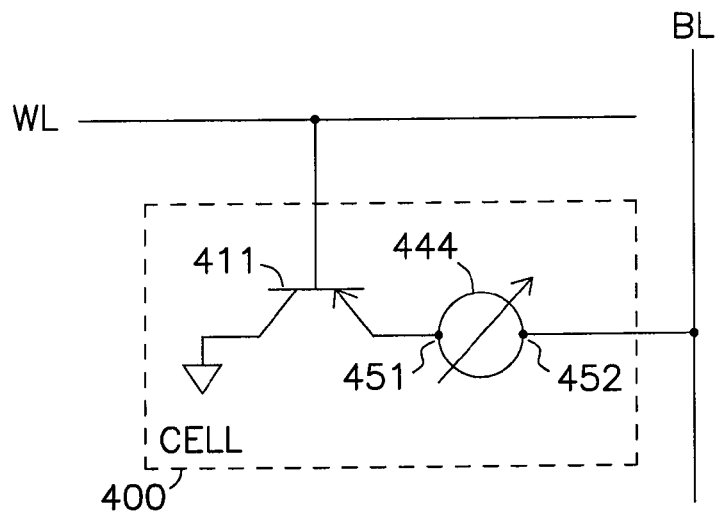
Figure 5:
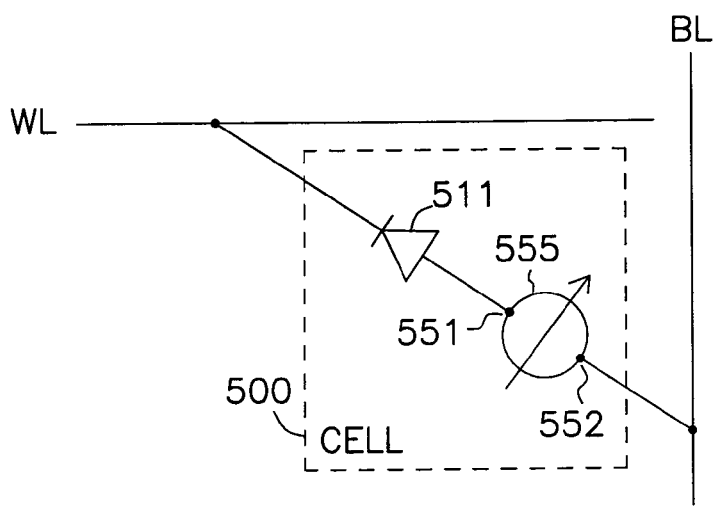

FIG. 3 through FIG. 5 show schematic diagrams of examples of different memory cells 300, 400, and 500 having different access components 311, 411, and 511 coupled to memory elements 333, 444, and 555 according to various embodiments of the invention. A line with a signal WL and a line with a signal BL in FIG. 3 through FIG. 5 may correspond to one of lines 104 and one of lines 106 of FIG. 1, respectively. FIG. 3 through FIG. 5 show examples of access components 311, 411, and 511 including a metal-oxide-semiconductor field-effect transistor (MOSFET), a bipolar junction transistor (BJT), and a diode, respectively. Memory cells 300, 400, and 500 may include other types of access components.

As shown in FIG. 3 through FIG. 5, each of memory elements 333, 444, and 555 may couple between two electrodes, such as electrodes 351 and 352 (FIG. 3), electrodes 451 and 452 (FIG. 4), or electrodes 551 and 552 (FIG. 5). FIG. 3 through FIG. 5 schematically show electrodes 351, 352, 451, 452, 551, and 552 as dots. Structurally, each of these electrodes may include a conductive material. In FIG. 3 through FIG. 5, access components 311, 411, and 511 may enable signals (e.g., voltage or current) to be transferred to and from memory elements 333, 444, and 555 via electrodes 351, 352, 451, 452, 551, and 552 during a programming on read operation.

For example, a programming operation may use signal WL to turn on access components 311, 411, and 511, and then apply a current (e.g., programming current) through memory elements 333, 444, and 555. The current causes at least a portion of the material of memory elements 333, 444, and 555 to heat up and melt. After the material melts, the programming operation may allow the material to rapidly cool down. These heat and cool actions may change the phase of the material, such as from a crystalline phase before the programming operation to an amorphous phase after the programming operation. The phase change may be reversible (e.g., changing from an amorphous phase to a crystalline phase). Different phases of the material may cause memory elements 333, 444, and 555 to have different resistance states with different resistance values, which correspond to different values of the information that is being stored in memory elements 333, 444, and 555.

In another example, a read operation may use signal WL to turn on access components 311, 411, and 511, and then apply a current (e.g., read current) through memory elements 333, 444, and 555. The read operation may measure the resistance of memory cells 300, 400, and 500 based on a read voltage to determine the corresponding value of information stored therein. For example, in each of memory cells 300, 400, and 500, a different resistance value may provide a different value (e.g., current or voltage value) on signal BL when the current passes through memory elements 333, 444, and 555. Other circuitry of the memory device (e.g., circuit such as I/O circuit 116 of FIG. 1) may use signal BL to measure the resistance value of memory elements 333, 444, and 555 to determine the value of the information.

The current used during a read operation may have a value different from the current used during a programming operation. For example, in a programming operation, the value of the signal (e.g., signals from line BL in FIG. 3 or FIG. 4 or from line WL in FIG. 5) that creates a current flowing through the memory element may be sufficient to cause the material of at least a portion of the memory element to change between different phases to alter the resistance value of the memory element based on the value of the information to be stored in memory elements 333, 444, and 555. In a read operation, the value of the signal (e.g., signals from line BL in FIG. 3 or FIG. 4 or from line WL in FIG. 5) that creates a current flowing through the memory element may be sufficient to create the current but insufficient to cause any portion of the memory element to change between different phases so that the value of the information stored in the memory element may remain unchanged in the read operation.

Memory cells 100, 200, 300, 400, and 500 of FIG. 1 through FIG. 5 may include a memory cell similar to or identical to one or more of the memory cells described below with reference to FIG. 6 through FIG. 34.

FIG. 6 through FIG. 9 show a memory cell 600 having a memory element 666 with a structure configured to have various resistance states 633, 733, 833, and 933 corresponding to various resistance values R0, R1, R2, and R3 according to various embodiments of the invention. As shown in FIG. 6 through FIG. 9, memory cell 600 may include electrodes 651 and 652 coupled to memory element 666. Memory cell 600 may also include other components, such as an access component that may be similar to or identical to access component 211, 311, 411, or 511 (FIG. 2 through FIG. 5). FIG. 6 through FIG. 9 omit the other components of memory cell 600 to help focus on the embodiments discussed herein. Further, for clarity, FIG. 6 through FIG. 9 show memory element 666 with cross-section lines (shading lines) and electrodes 651 and 652 without cross-section lines. Electrodes 651 and 652 may correspond to electrodes 351 and 352 (FIG. 3), electrodes 451 and 452 (FIG. 4), or electrodes 551 and 552 (FIG. 5), which are schematically shown as dots in FIG. 3 through FIG. 5. In FIG. 6 through FIG. 9, memory element 666 may include the same material for portions 601, 602, and 603. The material may be configured to change between multiple phases, e.g., between crystalline and amorphous phases. Memory element 666 may include a phase change material. Some phase change materials may include chalcogenide materials with various combinations of germanium (Ge), antimony (Sb), tellurium (Te), and other similar materials. Examples of phase change materials may include binary combinations such as germanium telluride (GeTe), indium selenide (InSe), antimony telluride (SbTe), gallium antimonide (GaSb), indium antimonide (InSb), arsenic telluride (AsTe), aluminum telluride (AlTe); ternary combinations such as germanium antimony telluride (GeSbTe), tellurium germanium arsenide (TeGeAs), indium antimony telluride (InSbTe), tellurium tin selenide (TeSnSe), germanium selenium gallide (GeSeGa), bismuth selenium antimonide (BiSeSb), gallium selenium telluride (GaSeTe), tin antimony telluride (SnSbTe), indium antimony germanide (InSbGe); and quaternary combinations such as tellurium germanium antimony sulfide (TeGeSbS), tellurium germanium tin oxide (TeGeSnO), and alloys of tellurium germanium tin gold, palladium tellurium germanium tin, indium selenium titanium cobalt, germanium antimony tellurium palladium, germanium antimony tellurium cobalt, antimony tellurium bismuth selenium, silver indium antimony tellurium, germanium antimony selenium tellurium, germanium tin antimony tellurium, germanium tellurium tin nickel, germanium tellurium tin palladium, germanium tellurium tin platinum. Among the phase change materials listed herein, some may provide an appropriate choice over the others, depending in part on the application of the device. For example, a compound of germanium (Ge), antimony (Sb), and telluride (Te) may be an appropriate choice for a phase change memory device, in part, because of its relatively quick switching speed (e.g., a few nanoseconds) between different resistance states. The compound of germanium (Ge), antimony (Sb), and telluride (Te) may have a formula $Ge_2Sb_5Te_5$. Most of the material compositions in this description list only the component elements. The relative amount of each component element in each of these material compositions is not limited to a particular value.

As shown in FIG. 6 through FIG. 9, memory element 666 may include a portion 601 directly contacting electrode 651, a portion 602 directly contacting electrode 652, and a portion 603 between portions 601 and 602. FIG. 6 shows portion 603 being located at a general area indicated by a broken circle to indicate that portion 603 may include a part of portion 601, a part of portion 602, or both. Portion 603 of memory element 666 may be referred to as a programmable portion (or programmable volume). A programming operation may program memory cell 600 to one of multiple possible resistance states 633, 733, 833, and 933 corresponding to one of resistance values (in ohm unit) R0, R1, R2, and R3. The value of the information stored in memory element 666 may be based on which one of resistance values R0, R1, R2, and R3 that memory element 666 may have.

FIG. 6 shows an example where memory element 666 may have resistance value R0 in which the material at portions 601, 602, and 603 has the same crystalline phase 613. A programming operation may program memory cell 600 to cause at least a part of portion 603 to "amorphize" (e.g., changes from a crystalline phase to an amorphous phase), resulting in an amorphized region 713, 813, or 913. As shown in FIG. 6 through FIG. 9, portion 603 (either before or after programming) is isolated from electrode 651 by portion 601 of memory element 666, and is isolated from electrode 652 by portion 602 of memory element 666. Isolating portion 603 from electrodes 651 and 652 may reduce heat from being directly transferred from portion 603 to electrodes 651 and 652 during programming of memory element 666, thereby decreasing potential heat loss. Thus, programming time may be reduced, a relatively lower amount of programming current may be used, and power may be saved. FIG. 7 through FIG. 9 show amorphized regions 713, 813, and 913 having different region sizes. For example, amorphized region 713 may have size that is smaller than of amorphized region 813. Amorphized region 813 may have a size that is smaller than that of amorphized region 913. Different sizes of the amorphized region of portion 603 may cause memory cell 600 to have a different resistance value (e.g., R1, R2, or R3) to represent different values of information.

Figure 10:
FIG. 10 is a chart showing example resistance values for the memory element of FIG. 6 through FIG. 9 and example corresponding stored information values based on the example resistance values.

FIG. 10 is a chart 1000 showing example resistance values R0, R1, R2, and R3 of the memory element 666 of FIG. 6 through FIG. 9 and example corresponding stored information values based on the example resistance values. Memory cell 600 may be configured to store information representing a value of multiple bits (e.g., two, three, four, or other bits). Chart 1000 of FIG. 10 shows an example where each of four resistance values R0, R1, R2, and R3 may be assigned to a unique value of four possible values "00", "01", "10", and "11" of two bits.

FIG. 11 through FIG. 14 show another memory cell 1100 having a memory element 1111 with another structure configured to have various resistance states 1133, 1233, 1333, and 1433 corresponding to various resistance values R0, R1, R2, and R3 according to various embodiments of the invention. Memory cell 1100 may also include other components, such as an access component that may be similar to or identical to access component 211, 311, 411, or 511 (FIG. 2 through FIG. 5). In FIG. 11 through FIG. 14, memory element 1111 may include material similar or identical to the material of memory element 666 of FIG. 6 through FIG. 9.

In FIG. 11 through FIG. 14, memory element 1111 may include a portion 1101 directly contacting electrode 1151, a portion 1102 directly contacting electrode 1152, and a portion 1103 between portions 1101 and 1102. FIG. 11 shows portion 1103 being located at a general area indicated by a broken circle to indicate that portion 1103 may include a part of portion 1101, a part of portion 1102, or both. Portion 1103 of memory element 1111 may be referred to as a programmable portion. A programming operation may program memory cell 1100 to one of multiple possible resistance states 1133, 1233, 1333, and 1433 corresponding to one of resistance values R0, R1, R2, and R3. The value of the information stored in memory cell 1100 may be based on which one of resistance values R0, R1, R2, and R3 that memory element 1111 may have. As shown in FIG. 11, memory cell 1100 may have resistance value R0 in which the material at portions 1101, 1102, and 1103 has the same crystalline phase 1113, and resistance value R1, R2, and R3 in which portion 1103 may have amorphized regions 1213, 1313, and 1413, respectively, with different region sizes that may correspond to information values, e.g., "00," "01," "10," and "11" of FIG. 10, that may be stored in memory cell 1100.

The description herein includes ways to program a memory cell of a phase change memory device such as memory device 101 or 201 (FIG. 1 or FIG. 2) in which the memory device may include a memory cell with a memory element having a structure such as the structure of memory element 666 (FIG. 6 through FIG. 9) and memory element 1111 (FIG. 11 through FIG. 14), or other structure.

The programming operation may include reset activities (occasionally called "reset" or "resetting") and set activities (occasionally called "set" or "setting"). The reset activities may change the memory cell to a resistance state in which the material of a programmable portion of the memory element may have one phase (e.g., amorphous phase) and material of the other portions of the memory element have another phase (e.g., crystalline phase). For example, the reset activity may change memory cell 600 (FIG. 6) from resistance state 633 corresponding to resistance value R0 to a resistance state 733, 833, or 933 (FIG. 7 through FIG. 9) corresponding to one of resistance values R1, R2, or R3. Thus, each of resistance states 733, 833, and 933 (FIG. 7) may be called a "reset" resistance state. Each of resistance values R1, R2, and R3 may be called a "reset" resistance value. The set activities may change the memory cell from a reset resistance state to a "set" resistance state at which the material of memory element 666 may have the same phase (e.g., crystalline phase), such as a resistance state 633 corresponding to resistance value R0 in FIG. 6. Thus, resistance state 633 may be called a "set" resistance state. Resistance value R0 may be called a "set" resistance value. The reset and set activities of the programming operations described herein may includes activities of the programming operations described below with reference to FIG. 15 through FIG. 34.

Figure 15:
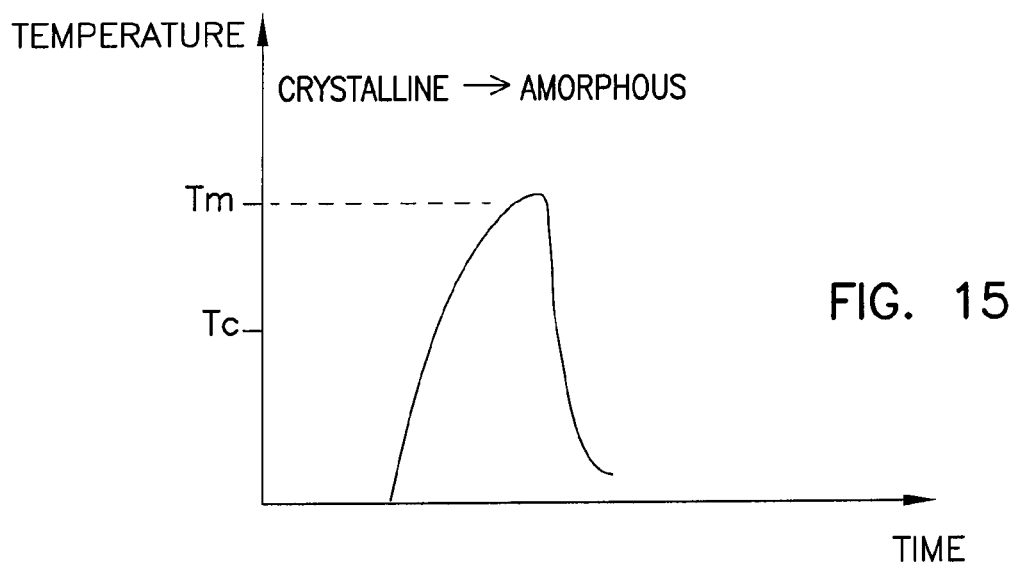
FIG. 15 is a graph of temperature versus time during a programming operation to reset a memory cell, such as one of the memory cells of FIG. 1 through FIG. 14, according to an embodiment of the invention.

FIG. 15 is a graph of temperature versus time during a programming operation to reset a memory cell, such as one of memory cell 100, 200, 300, 400, 500, 600, and 1100 of FIG. 1 through FIG. 14, according to an embodiment of the invention. As shown in FIG. 6 through FIG. 9 and FIG. 11 through FIG. 14, resistance values R0, R1, R2, and R3 may depend on the characteristics of the material at the programmable portion (e.g., portion 603 or 1103) of the memory cell. For example, different size of the amorphized region (713, 813, or 913 of FIG. 7 through FIG. 9) may result in a different resistance value (e.g., R1, R2, or R3).

As shown in FIG. 15, to reset the memory cell so that the programmable portion of the memory cell may have an amorphized region, the programming operation may use a signal to cause the material of at the programmable portion to heat and allow the temperature of material at the programmable portion to rise and exceed the material crystalline temperature Tc and melting point temperature Tm. The material at the programmable portion may melt. The programming operation may allow the material to cool (or rapidly cool) after it melts. As a result, the material at the programmable portion may amorphize and result in an amorphized region. The size of the amorphized region may depend on signal values of a signal used during the programming operation. The signal may include a pulse. The signal values may include an amplitude value of the pulse, the transition time value of the pulse (e.g., transition time value of an edge of the pulse), or both.

Figure 16:
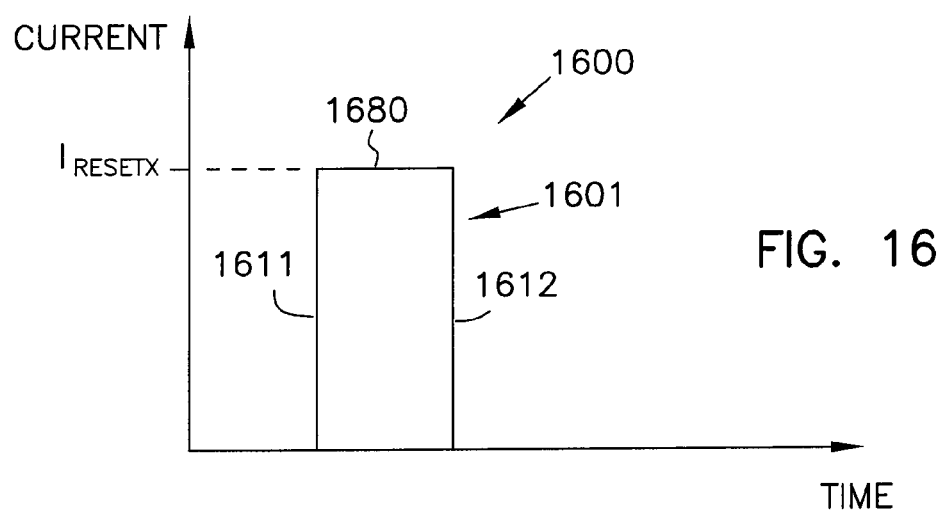
FIG. 16 is a graph of current versus time of a signal used during the programming operation described with reference to FIG. 15.

FIG. 16 is a graph of current versus time of a signal used during the programming operation described with reference to FIG. 15. As shown in FIG. 16, signal 1600 may include one or more pulses, such as a pulse 1601 having a square (or substantially square) wave shape where a transition time value (e.g., pulse rise time value) of edge 1611 and transition time value (e.g., pulse fall time value) of edge 1612 may be considerably less than the duration of pulse 1601. Pulse 1601 may also have an amplitude value 1680, which may correspond to a current value $I_{RESETX}$. Different values of amplitude value 1680 (e.g., different current values) may cause a programmable portion of a memory cell to amorphize to different amorphized regions with different sizes corresponding to different resistance values (e.g., R1, R2, and R3).

Figure 17:
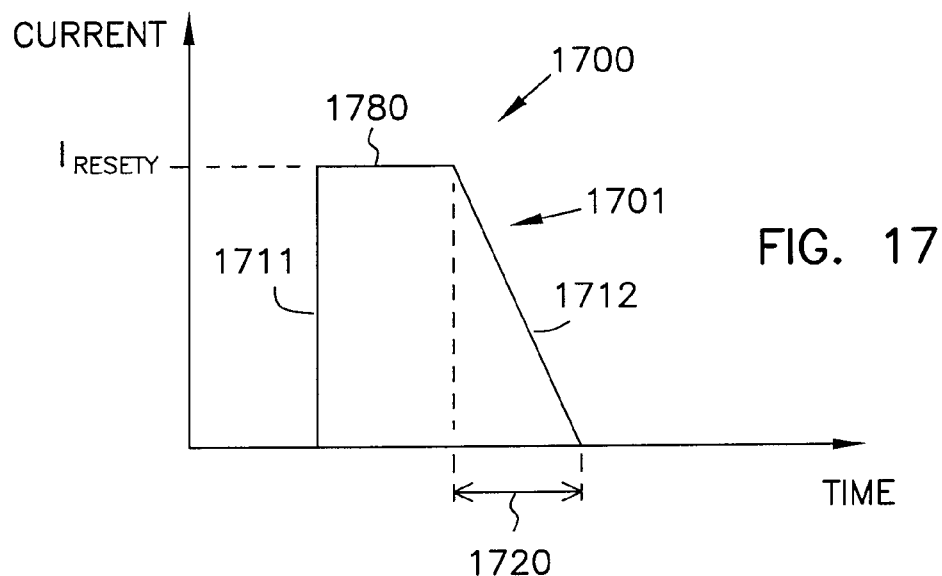
FIG. 17 is a graph of current versus time of another signal used during the programming operation described with reference to FIG. 15.

FIG. 17 is a graph of current versus time of another signal 1700 used during the programming operation described with reference to FIG. 15. As shown in FIG. 17 signal 1700 may include one or more pulses, such as a pulse 1701 having an amplitude value 1780, which may correspond to a current value $I_{RESETY}$. Pulse 1701 may also have edges 1711 and 1712. As shown in FIG. 17, unlike pulse 1601 of FIG. 16, pulse 1701 of FIG. 17 may have a shape different from a square wave shape. A transition time value (e.g., pulse rise time value) of edge 1711 and a transition time value (e.g., pulse fall time value) 1720 of edge 1712 are unequal. Different values of transition time value 1720 may cause a programmable portion of a memory cell to amorphize with different crystalline composition corresponding to different resistance values (e.g., R1, R2, and R3), with greater transition time value 1720 resulting in greater crystalline composition and lower resistance value.

As described above with reference to FIG. 16 and FIG. 17, to reset a memory cell to cause it to change from one resistance value (e.g., R0) to another resistance value (e.g., R1, R2, or R3), the programming operation may use a signal having a pulse with a square wave shape such as signal 1600 of FIG. 16, or a different signal such as signal 1700 of FIG. 17 with unequal rise time and fall time values.

Figure 18:
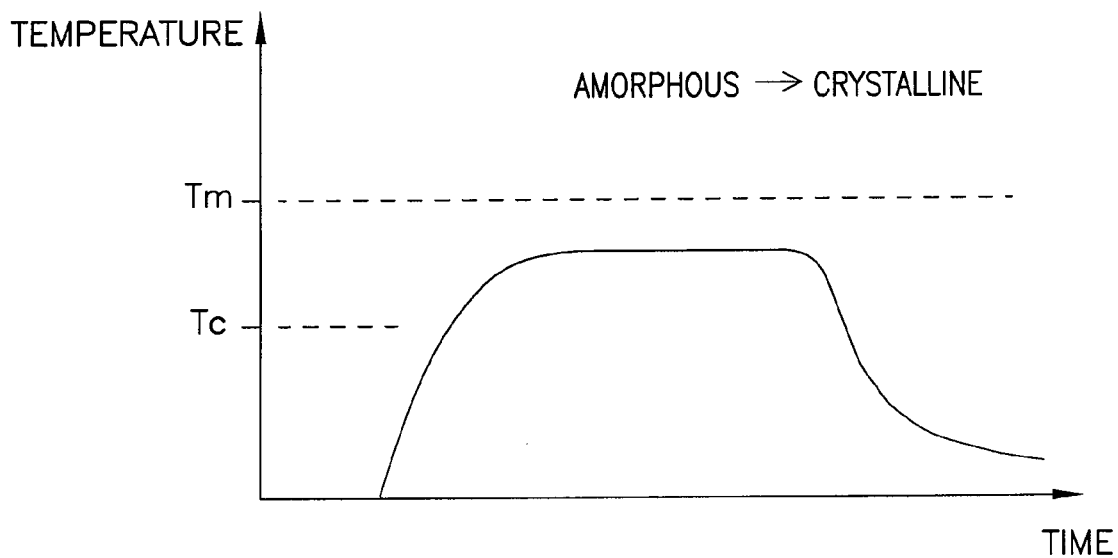
FIG. 18 is a graph of temperature versus time during a programming operation to set a memory element of a memory cell, such as the memory cell of FIG. 1 through FIG. 14, according to an embodiment of the invention.

FIG. 18 is a graph of temperature versus time during a programming operation to set a memory element of a memory cell, such as the memory cell 100, 200, 300, 400, 500, 600, and 1100 of FIG. 1 through FIG. 14, according to an embodiment of the invention. As shown in FIG. 18, the programming operation may use a signal to cause the material at the programmable portion to heat and allow the temperature of the material at the programmable portion to rise above its crystalline temperature Tc but below its melting point temperature Tm. The programming operation may hold the temperature of the material for an interval and then allow it to cool. As result, the programmable portion may "recrystallize" (e.g., change from an amorphous phase to a crystalline phase) such that the material of the programmable portion and other portions (e.g., portions 601, 602, and 603 of FIG. 6) may have the same phase, causing the memory cell to have a resistance value such as resistance value R0 of FIG. 6.

Figure 19:
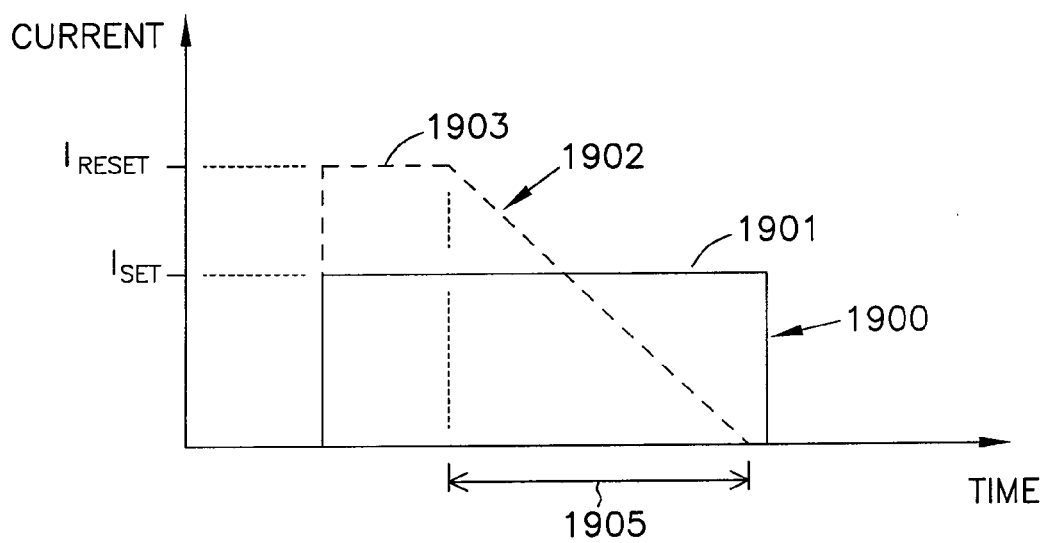
FIG. 19 is a graph of current versus time of signals that the programming operation described with reference to FIG. 18 may use.

FIG. 19 is a graph of current versus time of signals 1900 and 1902 that the programming operation described with reference to FIG. 18 may use. Either signal 1900 or 1902 may be used in the programming operation. As shown in FIG. 19, signal 1900 may include a pulse 1901 having a square (or substantially square) wave shape with an amplitude value corresponding to a current value $I_{SET}$, which is less than a current value $I_{RESET}$. Signal 1902 may include a pulse 1903 having a non-square shape with a fall time value 1905. FIG. 19 shows pulse 1903 having an amplitude value corresponding to a current value $I_{RESET}$ and fall time value 1905 as an example. The amplitude of pulse 1903 and the fall time value of pulse 1905 may vary. Current value $I_{RESET}$ of FIG. 19 may correspond to current value $I_{RESETX}$ (FIG. 16) or $I_{RESETY}$ (FIG. 17).

Figure 20:
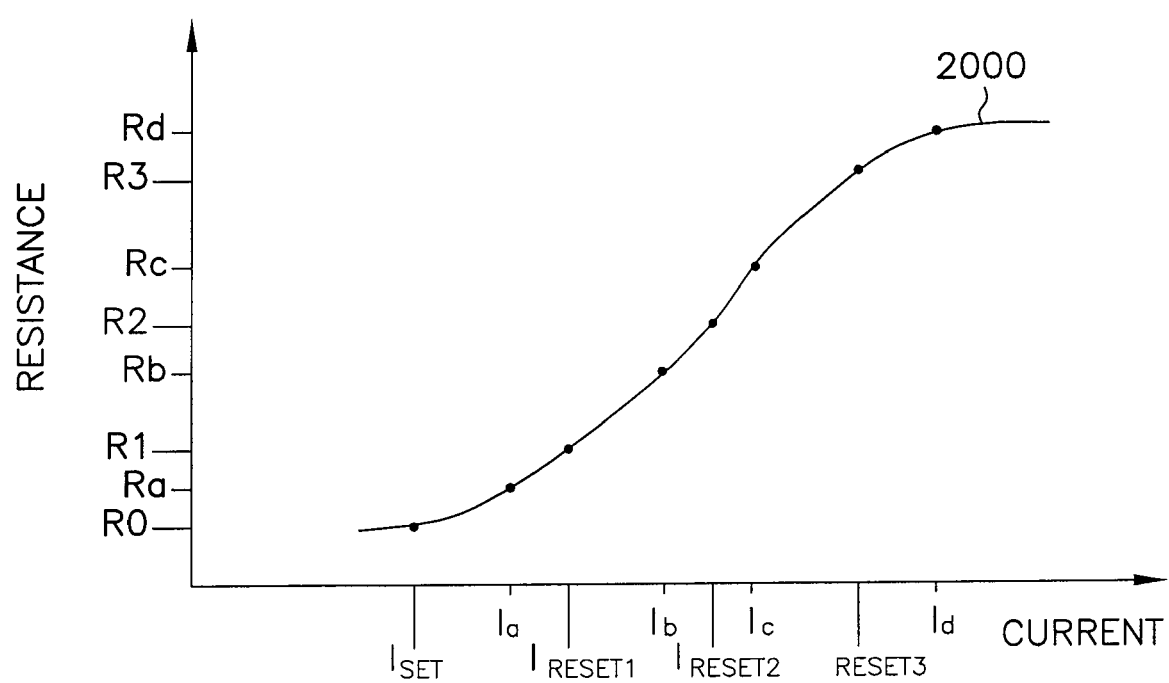
FIG. 20 is a graph of a curve showing a relationship between resistance values and current values for use as target values during a programming operation according to an embodiment of the invention.

FIG. 20 is a graph of a curve 2000 showing a relationship between resistance values R0, R1, R2, and R3 and current values $I_{SET}$, $I_{RESET1}$, $I_{RESET2}$, and $I_{RESET3}$ for use as target values during a programming operation according to an embodiment of the invention. The device associated with FIG. 20 may store (e.g., in form of values in a table) the relationship presented by curve 2000 in a storage area of the device, such as a storage area similar to or identical to storage area 144 of memory device 101 of FIG. 1. In determining the relationship, the device associated with FIG. 20 may include activities to characterize (e.g., program and then read) one or more selected memory cells during an interval such as during device initialization. For example, the device may program (e.g., during device initialization) one or more selected memory cells using different signals with different pulse amplitude values corresponding to different programming current values (e.g., $I_{SET}$, Ia, $I_{RESET1}$, Ib, $I_{RESET2}$, Ic, $I_{RESET3}$, and Id of FIG. 20). Then, the device may read the selected memory cells (e.g., during device initialization) to obtain their resistance values (e.g., R0, Ra, R1, Rb, R2, Rc, R3, and Rd of FIG. 20) corresponding to the different programming current values. Thus, many different programming current values may be used to construct the relationship (presented by curve 2000), which may or may not include the resistance values R0, R1, R2, and R3. If resistance values R0, R1, R2, and R3 are not included, they may be extrapolated from the relationship. A programming operation (e.g., after the initialization) may use this relationship (e.g., values from the table) to program a memory cell.

In FIG. 20, each of resistance values R0, R1, R2, and R3 may be called a target resistance value, occasionally referred to as $R_{TAR}$. $R_{TAR}$ is the intended resistance value that the memory cell is to be programmed. The programming operation may determine $R_{TAR}$ based on the value of information to be stored in the memory cell. Each of current values $I_{SET}$, $I_{RESET1}$, $I_{RESET2}$, and $I_{RESET3}$ may be called a target current value (occasionally referred to as $I_{TAR}$). During a programming operation, e.g., after the initialization, the programming operation may select one of current values $I_{SET}$, $I_{RESET1}$, $I_{RESET2}$, and $I_{RESET3}$ to be $I_{TAR}$, depending on which one the resistance values R0, R1, R2, and R3 is determined to be $R_{TAR}$. Thus, $I_{TAR}$ is the current value that the programming operation may initially select to start the programming of a memory cell. During programming, the programming operation may successively adjust $I_{TAR}$ to program the memory cell until the memory cell has a resistance value equal to $R_{TAR}$ or to a value within an acceptable range of $R_{TAR}$.

The programming operation may select different values of $I_{TAR}$ to program different selected memory cells if the selected memory cells are to be programmed with different information values. For example, based on the relationship between resistance values R0, R1, R2, and R3 and current values $I_{SET}$, $I_{RESET1}$, $I_{RESET2}$, and $I_{RESET3}$, the programming operation may select $I_{TAR}=I_{RESET1}$ (and successively adjust $I_{RESET1}$) to program a first memory cell if the information to be stored in the first memory cell corresponds to resistance value R1. Then, programming operation may select $I_{TAR}=I_{RESET2}$ (and successively adjust $I_{RESET2}$) to program a second memory cell if the information to be stored in the second memory cell corresponds to resistance value R2.

Figure 21:
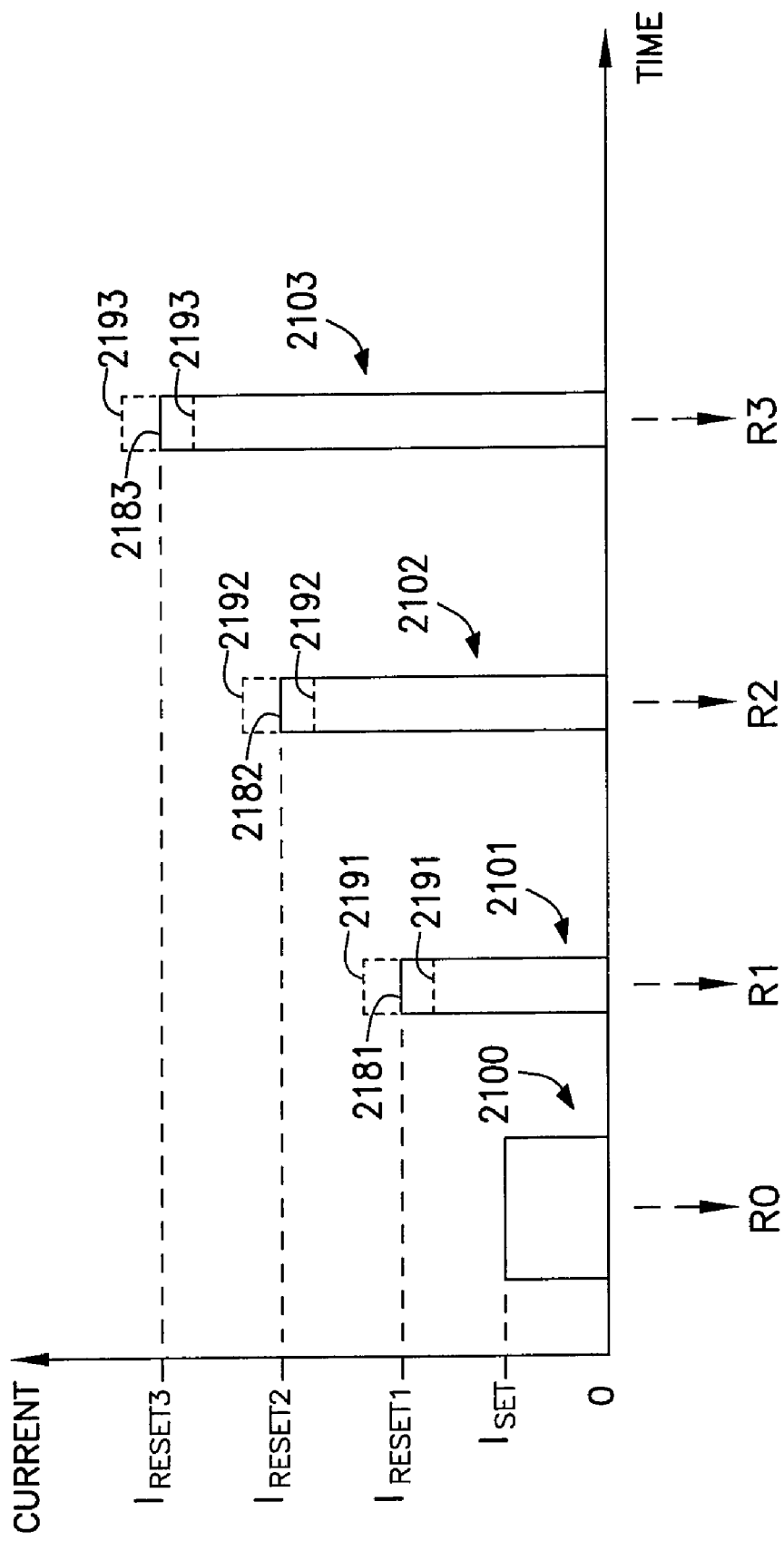
FIG. 21 is a graph of current versus time of different signals with pulses having adjustable amplitude values used during a programming operation according to an embodiment of the invention.

FIG. 21 is a graph of current versus time of different signals with pulses 2100, 2101, 2102, and 2103 having adjustable amplitude values 2181, 2182, and 2183 used during a programming operation according to an embodiment of the invention. Amplitude values 2181, 2182, and 2183 may correspond to current values $I_{RESET1}$, $I_{RESET2}$, and $I_{RESET3}$, respectively, which are greater than a current value $I_{SET}$. A programming operation may use pulses 2100, 2101, 2102, and 2103 to cause a memory cell to have corresponding resistance values R0, R1, R2, and R3, respectively. Current values $I_{SET}$, $I_{RESET1}$, $I_{RESET2}$, and $I_{RESET3}$ of FIG. 21 may correspond to those of FIG. 20.

As shown in FIG. 21, the programming operation may adjust amplitude values 2181, 2182, and 2183 to obtain adjusted amplitude values 2191, 2192, and 2193, respectively. Each of adjusted amplitude values 2191, 2192, and 2193 may include a value that is less than or greater than its corresponding amplitude value by an adjusted amplitude amount. For example, as shown in FIG. 21, adjusted amplitude value 2192 may be less than or greater than amplitude value 2182. Depending on the value of $R_{TAR}$, the programming operation may select one of amplitude values 2181, 2182, and 2183 as an initial target amplitude value and may adjust the selected initial target amplitude value during programming to program the memory cell until its programmed resistance value (occasionally referred to as $R_{PRG}$) is equal to $R_{TAR}$ (e.g., R1, R2, or R3) or is within an acceptable range of $R_{TAR}$.

Figure 22:
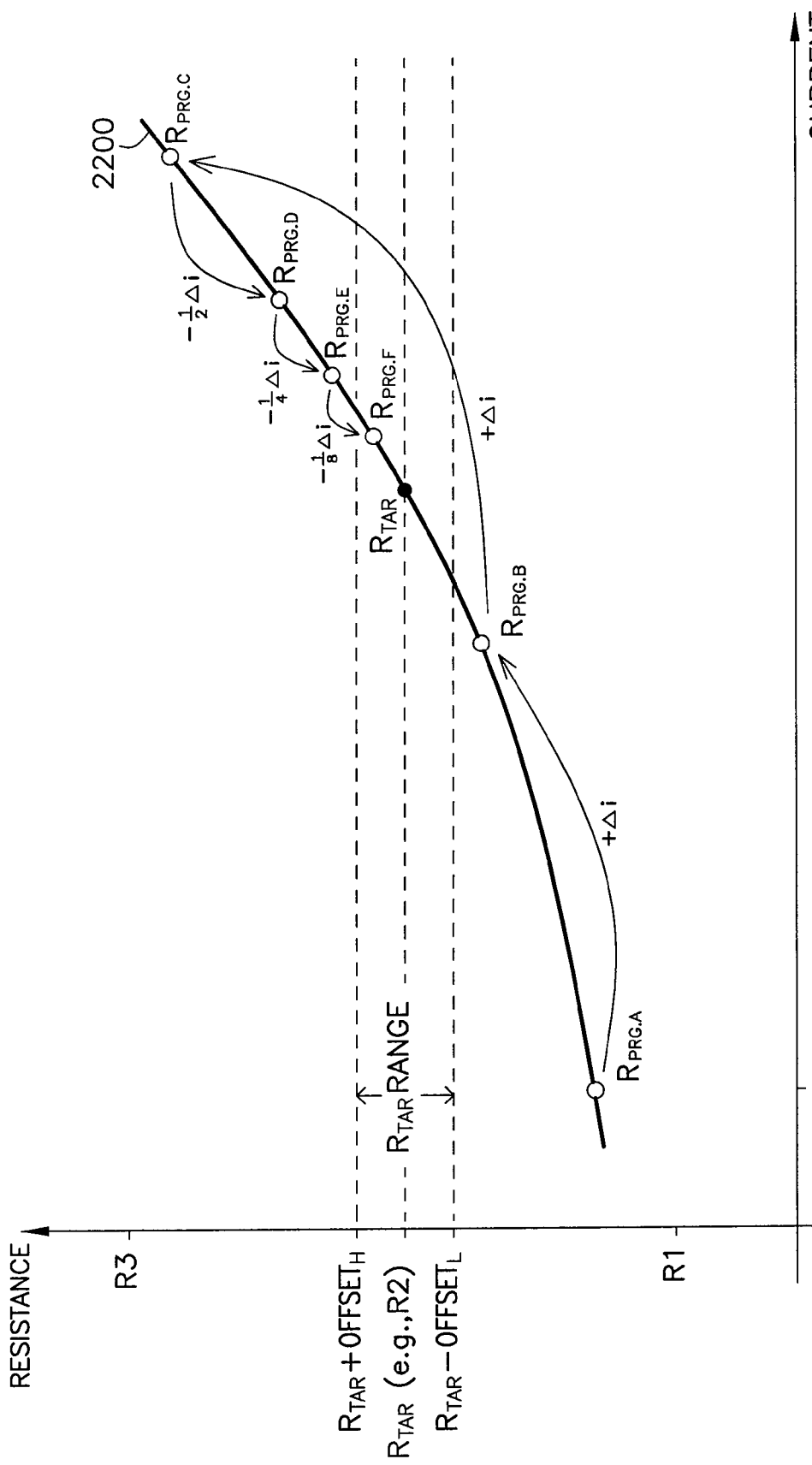
FIG. 22 is a graph showing resistance versus current during an example programming operation according to an embodiment of the invention.

FIG. 22 is a graph showing resistance versus current during an example programming operation according to an embodiment of the invention. As described above with reference to FIGS. 20 and 21, $R_{TAR}$ may represent a target resistance value to be programmed to a memory cell. $R_{TAR}$ in FIG. 22 may correspond to one of R1, R2, and R3 of FIG. 20 and FIG. 21. For the purposes of describing the example programming operation associated with FIG. 22, $R_{TAR}$ is assumed to be resistance value R2. The programming operation may finish programming the memory cell when the memory cell has a resistance value within a target resistance value range of $R_{TAR}$ (occasionally referred to as the $R_{TAR}$ range). As shown in FIG. 22, the $R_{TAR}$ range may include an upper resistance value equal to $R_{TAR}$ plus an offset value $OFFSET_H$, and a lower resistance value equal to $R_{TAR}$ minus an offset value $OFFSET_L$. $OFFSET_H$ and $OFFSET_L$ may have an equal value. $OFFSET_H$ may have a value (e.g., less than half of a difference between $R_{TAR}$, e.g., R2, and a next higher target resistance value, e.g., R3) such that the upper resistance value ($R_{TAR}+OFFSET_H$) of FIG. 22 may not overlap the lower resistance value (e.g., R3 minus $OFFSET_L$) of another target resistance value range. Similarly, $OFFSET_L$ may have a value (e.g., less than half of a difference between $R_{TAR}$, e.g., R2, and a next lower target resistance value, e.g., R1) such that the lower resistance value ($R_{TAR}-OFFSET_L$) of FIG. 22 may not overlap the upper resistance value (e.g., R1 plus $OFFSET_H$) of another target resistance value range.

In FIG. 22, $R_{PRG.A}$, $R_{PRG.B}$, $R_{PRG.C}$, $R_{PRG.D}$, $R_{PRG.E}$, and $R_{PRG.F}$ may represent various programmed resistance values that the memory cell may have during various repeated programming. The programming operation may repeat programming (e.g., resetting) the memory cell more than one time in an attempt to cause the programmed resistance value to be within the $R_{TAR}$ range.

As described above with reference to FIG. 20, based on a relationship between resistance value and current value, a programming operation may use a signal with an initial target amplitude value corresponding to current value $I_{RESET1}$, $I_{RESET2}$, or $I_{RESET3}$ to reset the memory cell to resistance value R1, R2, or R3. Here, in the example of FIG. 22, since $R_{TAR}$ is assumed to be resistance value R2, the programming operation may use a signal having a pulse with an initial target amplitude value corresponding to target current value $I_{TAR}=I_{RESET2}$ to program the memory cell so that $R_{TAR}$ (or R2 in this example) may be programmed into the memory cell.

The programming operation associated with FIG. 22 may include the following activities. The programming operation may initially use a current value (e.g., $I_{RESET2}$) to program the memory cell. If the programmed resistance value $R_{PRG}$ is outside the $R_{TAR}$ range, then the programming operation may successively adjust the current value (e.g., by increasing or decreasing the current value by an adjusted current amount such as $\Delta i$, ½ $\Delta i$, ¼ $\Delta i$, ⅛ $\Delta i$, or 1/16 $\Delta i$) to obtain different adjusted current values. Adjusted current amounts such as $\Delta i$, ½ $\Delta i$, ¼ $\Delta i$, ⅛ $\Delta i$, and 1/16 $\Delta i$) may be called adjusted parameter amounts. After each adjustment, the programming operation may use the adjusted current values and repeat programming the memory cell until $R_{PRG}$ is within the $R_{TAR}$ range.

For example, in FIG. 22, after being programmed using a current value $I_{RESET2}$, the memory cell may have $R_{PRG.A}$, which is outside the $R_{TAR}$ range and less than $R_{TAR}$. Thus, the programming operation may adjust $I_{RESET2}$ and repeat the programming until the memory cell has the programmed resistance value (e.g., $R_{PRG.F}$) that is within the $R_{TAR}$ range.

As shown in FIG. 22, the memory cell may have $R_{PRG.A}$, which is outside the $R_{TAR}$ range, after being programmed using an initial current value $I_{RESET2}$. To repeat programming, the programming operation may adjust $I_{RESET2}$ by increasing $I_{RESET2}$ by $\Delta i$, and then repeat programming the memory cell using an adjusted current value $I_{RESET2B}=I_{RESET2}+\Delta i$.

After programming using $I_{RESET2B}$, the memory cell may have $R_{PRG.B}$, which is still outside the $R_{TAR}$ range and less than $R_{TAR}$. Thus, the programming operation may adjust $I_{RESET2B}$ by increasing $I_{RESET2B}$ by $\Delta i$, and then repeat programming the memory cell using an adjusted current value $I_{RESET2C}=I_{RESET2B}+\Delta i$. The programming operation may keep increasing the current value by $\Delta i$ until the programmed resistance value is either within the $R_{TAR}$ range (then the programming operation may finish programming the memory cell) or outside the $R_{TAR}$ range but greater than $R_{TAR}$ (then the programming operation may continue but with an adjusted current amount less than $\Delta i$).

In FIG. 22, after programming using $I_{RESET2C}$, the memory cell may have $R_{PRG.C}$, which is still outside the $R_{TAR}$ range but greater than $R_{TAR}$. Thus, the programming operation may adjust $I_{RESET2C}$ by decreasing $I_{RESET2C}$ by ½ $\Delta i$, and then repeat programming the memory cell using an adjusted current value $I_{RESET2D}=I_{RESET2C}-½ \Delta i$.

After programming using $I_{RESET2D}$, the memory cell may have $R_{PRG.D}$, which is still outside the $R_{TAR}$ range and greater than $R_{TAR}$. Thus, the programming operation may adjust $I_{RESET2D}$ by decreasing $I_{RESET2D}$ by ¼ $\Delta i$, and then repeat programming the memory cell using an adjusted current value $I_{RESET2E}=I_{RESET2D}-¼ \Delta i$.

After programming using $I_{RESET2E}$, the memory cell may have $R_{PRG.E}$, which is still outside the $R_{TAR}$ range and greater than $R_{TAR}$. Thus, the programming operation may adjust $I_{RESET2E}$ by decreasing $I_{RESET2E}$ by ⅛ $\Delta i$, and then repeat programming the memory cell using an adjusted current value $I_{RESET2F}=I_{RESET2E}-⅛ \Delta i$. After programming using $I_{RESET2F}$, the memory cell may have $R_{PRG.F}$, which is within the $R_{TAR}$ range. Since $R_{PRG.F}$ is within the $R_{TAR}$ range, the programming operation may finish programming the memory cell.

As described above, the programming operation may increase the previous current value by an adjusted current amount (e.g., Δi) if after being programmed, the memory cell has a programmed resistance value (e.g., $R_{PRG.A}$ or $R_{PRG.B}$) that is outside the $R_{TAR}$ range and less than $R_{TAR}$. In the opposite, the programming operation may decrease the previous current value by an adjusted current amount (e.g., ½ Δi, ¼ Δi, or ⅛ Δi) if after being programmed, the memory cell has a resistance value (e.g., $R_{PRG.C}$, $R_{PRG.D}$ or $R_{PRG.E}$) that is outside the $R_{TAR}$ range and greater than $R_{TAR}$. Since the adjusted current amount (Δi, ½ Δi, ¼ Δi, ⅛ Δi, or 1/16 Δi) may be different (e.g., varied) when the current value is adjusted, the adjusted current amount may include a variable current amount.

In FIG. 22, Δi may be called a selected current amount. The device associated with FIG. 22 may select the value of Δi to be any appropriate value. However, to improve the chance of a programmed resistance to be within the $R_{TAR}$ range or to reduce the number of repeated programming, for example, the device may select the value of Δi based on a difference in values between two adjacent reset current values from a resistance value versus current value curve, such as curve 2200 of FIG. 22. For example, the device may select the value of Δi to be equal to the difference between $I_{TAR}$+OFFSET'$_H$ and $I_{TAR}$−OFFSET'$_L$ or less than (e.g., one-half of) the difference between $I_{TAR}$+OFFSET'$_H$ and $I_{TAR}$+OFFSET'$_L$. $I_{TAR}$+OFFSET'$_H$ and $I_{TAR}$−OFFSET'$_L$ may include current values of the pulses that are used to obtain $R_{TAR}$+OFFSET$_H$ and $R_{TAR}$−OFFSET$_L$ respectively.

Figure 23:
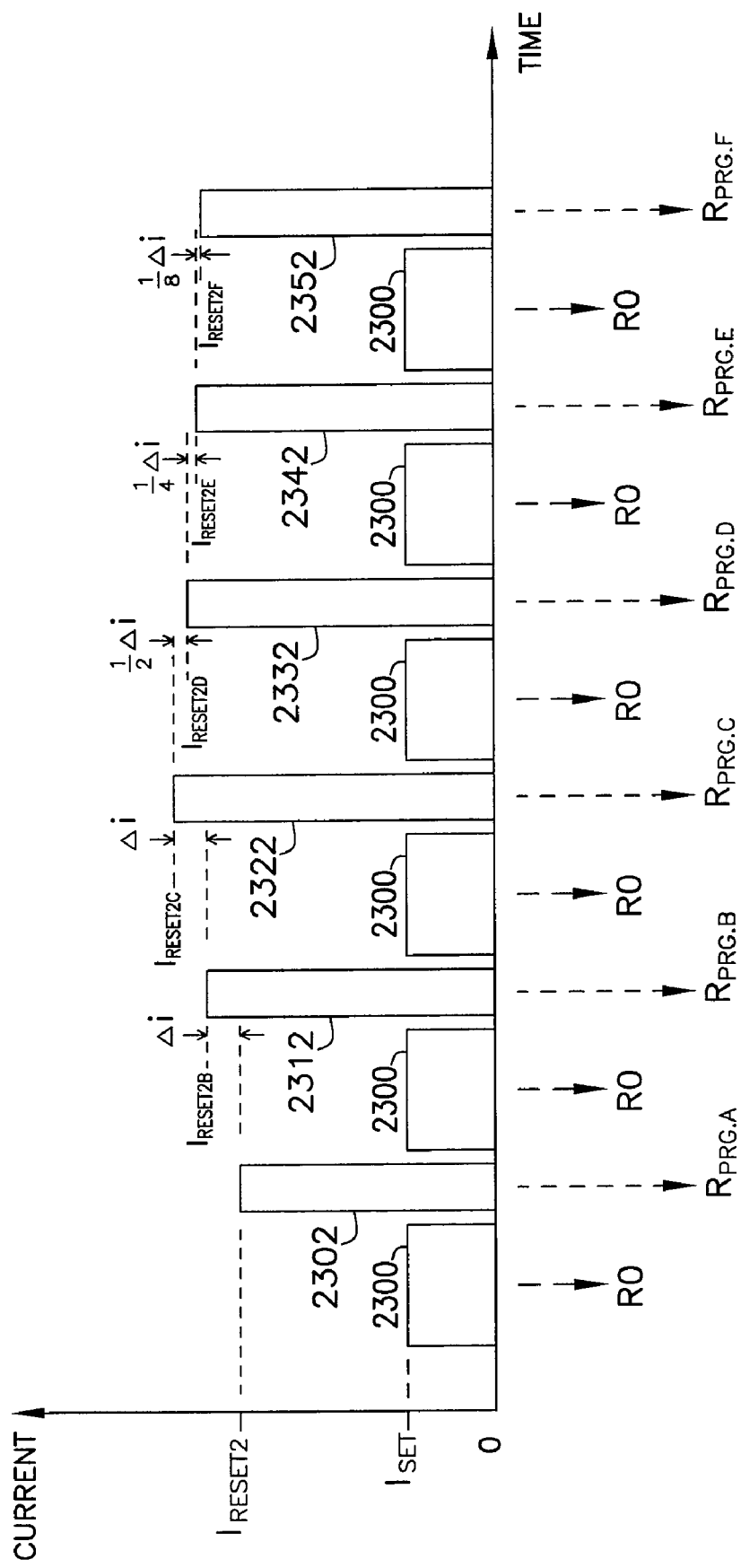
FIG. 23 is a graph showing various adjusted current values based on an initial target current value used during the example programming operation associated with FIG. 22.

FIG. 23 is a graph showing various adjusted current values based on an initial target current value used during the example programming operation associated with FIG. 22. As shown in FIG. 23, the programming operation may initially use a signal with a pulse 2302 having an amplitude value corresponding to current value $I_{RESET2}$ to reset the memory cell and successively adjust the amplitude of pulse 2302 to obtain adjusted pulses 2312, 2322, 2332, 2342, and 2352 of the signal with the adjusted amplitude values corresponding to adjusted current values $I_{RESET2B}$, $I_{RESET2C}$, $I_{RESET2D}$, $I_{RESET2E}$, and $I_{RESET2F}$, respectively. Current values such as $I_{RESET2}$, $I_{RESET2B}$, $I_{RESET2C}$, $I_{RESET2D}$, $I_{RESET2E}$, and $I_{RESET2F}$ may be called programming parameter values. The programming operation may then use these programming parameter values and repeat the programming until the programmed resistance value (e.g., $R_{PRG.F}$ in FIG. 22) is within the $R_{TAR}$ range (FIG. 22).

Further, as shown in FIG. 23, the programming operation may use a signal 2300 having a pulse amplitude value corresponding to current value $I_{SET}$ to program (e.g., set) the memory cell to an initial resistance value (e.g., R0) before each time the programming operation programs (e.g., resets) the memory cell that results in the memory cell having programmed resistance value $R_{PRG.A}$, $R_{PRG.B}$, $R_{PRG.C}$, $R_{PRG.D}$, $R_{PRG.E}$, or $R_{PRG.F}$. Setting the memory cell before each time it is reset may allow the memory cell to have a consistent initial resistance value (e.g., R0) to improve the programming operation.

Figure 24:
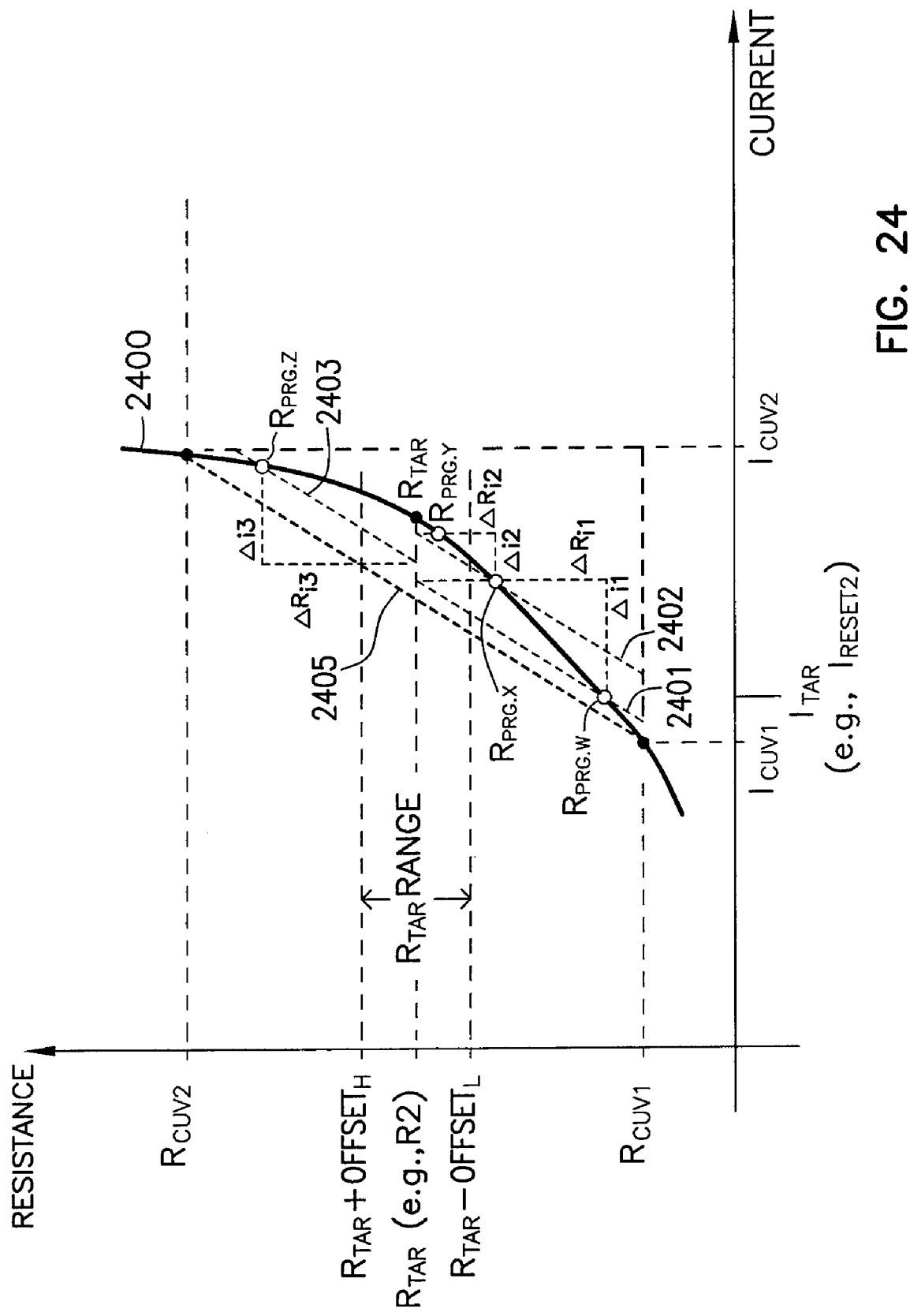
FIG. 24 is a graph showing resistance versus current during an example programming operation using adjusted current values based on slope calculations according to an embodiment of the invention.

FIG. 24 is a graph showing resistance versus current during an example programming operation using adjusted current values based on slope calculations according to an embodiment of the invention. $R_{TAR}$ may represent a target resistance value to be programmed to a memory cell. $R_{TAR}$ may correspond to one of R1, R2, and R3 of FIG. 20 and FIG. 21. For the purposes of describing FIG. 24, $R_{TAR}$ is assumed to be resistance value R2. FIG. 24 also shows an $R_{TAR}$ range, which may include resistance values within an upper resistance value equal to $R_{TAR}$ plus an offset value OFFSETH, and a lower resistance value equal to $R_{TAR}$ minus an offset value OFFSET$_L$. $R_{PRG.W}$, $R_{PRG.X}$, $R_{PRG.Y}$, and $R_{PRG.Z}$ may represent various programmed resistance values that the memory cell may have during various repeated programming to cause the programmed resistance (e.g., $R_{PRG.Y}$) value to be within the $R_{TAR}$ range.

As described above with reference to FIG. 20, based on a relationship between resistance value and current value, a programming operation may use a signal with an initial target amplitude value corresponding to current value $I_{RESET1}$, $I_{RESET2}$, or $I_{RESET3}$ to reset the memory cell to resistance value R1, R2, or R3. Here, in the example of FIG. 24, since $R_{TAR}$ is assumed to be resistance value R2, the programming operation may use a signal having a pulse with an initial target amplitude value corresponding to target current value $I_{TAR}$=$I_{RESET2}$ to program the memory cell so that $R_{TAR}$ (or R2 in this example) may be programmed into the memory cell. Unlike the programming operation associated with FIG. 22, the programming operation associated with FIG. 24 may adjust the current value based on slope calculations.

The programming operation associated with FIG. 24 may include the following activities. The programming operation may initially use current value (e.g., $I_{RESET2}$) to program the memory cell. If the programmed resistance value $R_{PRG}$ is outside the $R_{TAR}$ range, then the programming operation may successively adjust (e.g., by increasing or decreasing the current value by an adjusted current amount such as Δi1, Δi2, or Δi3) the current value based on slope calculations to obtain different adjusted current values. Adjusted current amounts such as Δi1, Δi2, and Δi3 may be called adjusted parameter amounts. After each adjustment, the programming operation may use the adjusted current values and repeat programming the memory cell until $R_{PRG}$ (e.g., $R_{PRG.Y}$ in FIG. 24) is within the $R_{TAR}$ range.

For example, in FIG. 24, after being programmed using current value $I_{RESET2}$, the memory cell may have $R_{PRG.W}$, which is outside the $R_{TAR}$ range and less than $R_{TAR}$. The programming operation may increase $I_{RESET2}$ to an adjusted current value $I_{RESET2X}$=$I_{RESET2}$+Δi1 and repeat the programming.

After being programmed using $I_{RESET2X}$, the memory cell may have $R_{PRG.X}$, which is still outside the $R_{TAR}$ range and less than $R_{TAR}$. The programming operation may increase $I_{RESET2X}$ to adjusted current value $I_{RESET2Y}$=$I_{RESET2X}$+Δi2 and repeat the programming.

After being programmed using $I_{RESET2Y}$, the memory cell may have $R_{PRG.Y}$, which is within the $R_{TAR}$ range and less than $R_{TAR}$. Since $R_{PRG.Y}$ is within the $R_{TAR}$ range, the programming operation may finish programming the memory cell.

In the above example, instead of the situation where the memory cell may have $R_{PRG.W}$ after it is programmed using the initial $I_{RESET2}$, the memory cell may have $R_{PRG.Z}$. As shown in FIG. 24, $R_{PRG.Z}$ is outside the $R_{TAR}$ range and greater than $R_{TAR}$. In this situation, the programming operation may decrease $I_{RESET2}$ to an adjusted current value $I_{RESET2Y}$=$I_{RESET2}$−Δi3 and repeat the programming. If the memory cell has $R_{PRG.Y}$ after it is programmed using $I_{RESET2Y}$, then the programming operation may finish programming the memory cell. Otherwise, the programming operation may repeat one or more times using other adjusted current values until $R_{PRG}$ is within the $R_{TAR}$ range.

As described above, the programming operation may increase the previous current value by an adjusted current amount (e.g., Δi1 or Δi2) if, after being programmed, the memory cell has a resistance value (e.g., $R_{PRG.W}$ or $R_{PRG.X}$) outside the $R_{TAR}$ range and less than $R_{TAR}$. In the opposite case, the programming operation may decrease the previous current value by an adjusted current amount (e.g., Δi3) if after being programmed the memory cell has a resistance value (e.g., $R_{PRG.Z}$) outside the $R_{TAR}$ range and greater than $R_{TAR}$.

The programming operation may determine the value of adjusted current amounts $\Delta i1$, $\Delta i2$, and $\Delta i3$ based on slope calculations as follows.

FIG. 24 shows curve 2400 having a slope 2405 between two points $R_{CUV1}$ and $R_{CUV2}$, which may have values (resistance values) of two points that are relative closer to both sides of $R_{TAR}$ on curve 2400. For example, if $R_{TAR}$ is assumed to be R2, then points $R_{CUV1}$ and $R_{CUV2}$ may have values equal to resistance values R1 and R3, respectively. In another example, although FIG. 24 shows points $R_{CUV1}$ and $R_{CUV2}$ as being outside $R_{TAR}$ range, points $R_{CUV1}$ and $R_{CUV2}$ however may have values equal to $R_{TAR}+OFFSET_H$ and $R_{TAR}-OFFSET_L$, respectively (two points where curve 2400 intersects lines represented by $R_{TAR}+OFFSET_H$ and $R_{TAR}-OFFSET_L$). The programming operation may use the value of slope 2405 to determine the value of the adjusted current amount (e.g., $\Delta i1$, $\Delta i2$, or $\Delta i3$) that it may use during one or more repeated programming.

As shown in FIG. 24, after programming using $I_{RESET2}$, the memory cell may have $R_{PRG.W}$, which is still outside the $R_{TAR}$ range and less than $R_{TAR}$. Thus, as described above, the programming operation may increase $I_{RESET2}$ by an adjusted current amount and repeat the programming. Since slope 2405 is calculated based on two points that are relatively closer to $R_{TAR}$, using slope 2405 to calculate the adjusted current amount (e.g., $\Delta i1$) to be used in the next (repeated) programming may improve a chance of the next resistance value (e.g., $R_{PRG.X}$ or $R_{PRG.Y}$ resulted from the next programming) being within the $R_{TAR}$ range. The programming operation may determine the value of $\Delta i1$ by equating the value of the slope of $R_{PRG.W}$ and $R_{TAR}$ (e.g., slope 2401 in FIG. 24) to the value of slope 2405 ($slope_{2405}$). The value of slope 2405 and value of slope 2401 ($slope_{2401}$) may follows expressions (1) and (2), respectively.

$$slope_{2405}=(R_{CUV2}-R_{CUV1})/(I_{CUV2}-I_{CUV1}) \quad (1)$$

$$slope_{2401}=\Delta R_{i1}/\Delta i1=(R_{TAR}-R_{PRG.W})/\Delta i1 \quad (2)$$

If $slope_{2401}=slope_{2405}$, then based on expressions (1) and (2), $$(R_{TAR}-R_{PRG.W})/\Delta i1=(R_{CUV2}-R_{CUV1})/(I_{CUV2}-I_{CUV1}) \quad (3)$$

Thus, based on expression (3), $\Delta i1$ may follow expression (4) or (5) below.

$$\Delta i1=(R_{TAR}-R_{PRG.W})*[(I_{CUV2}-I_{CUV1})/(R_{CUV2}-R_{CUV1})] \quad (4) \text{ or}$$

$$\Delta i1=(R_{TAR}-R_{PRG.W})*(1/slope_{2405}) \quad (5)$$

Since the values for each of the variables on the right side of expression (5) is known, the value of $\Delta i1$ may be determined.

In calculations similar to that of expression (5), the value of $\Delta i2$ and $\Delta i3$ may be determined by expressions (6) and (7) as follows.

$$\Delta i2=\Delta R_{i2}/\Delta i2=(R_{TAR}-R_{PRG.X})*[(I_{CUV2}-I_{CUV1})/(R_{CUV2}-R_{CUV1})] \text{ or}$$

$$\Delta i2=(R_{TAR}-R_{PRG.X})*(1/slope_{2405}) \quad (6)$$

$$\Delta i3=\Delta R_{i3}/\Delta i3=(R_{TAR}-R_{PRG.Z})*[(I_{CUV2}-I_{CUV1})/(R_{CUV2}-R_{CUV1})] \text{ or}$$

$$\Delta i3=(R_{TAR}-R_{PRG.Z})*(1/slope_{2405}) \quad (7)$$

Since the programmed resistance value (e.g., $R_{PRG.W}$ or $R_{PRG.X}$) may have a value that is less than $R_{TAR}$ or greater than $R_{TAR}$ (e.g., $R_{PRG.Z}$ is greater than $R_{TAR}$), and since a programming operation may increase or decrease the current value by a positive adjusted current value (e.g., $\Delta i1$, $\Delta i2$, or $\Delta i3$), expressions (5), (6), and (7) above may be generally expressed as $\Delta ix=|R_{TAR}-R_{PRG}|*(1/slope_{2405})$, which is absolute value of a difference between $R_{TAR}$ and $R_{PRG}$ times ($1/slope_{2405}$), where $\Delta ix$ represents an adjusted current amount (e.g., $\Delta i1$, $\Delta i2$, or $\Delta i3$) to be used in a repeated programming, and $R_{PRG}$ represents the programmed resistance value (e.g., $R_{PRG.W}$, $R_{PRG.X}$ or $R_{PRG.Z}$) that the memory cell may have after a previous programming. As described herein, since the adjusted current amount ($\Delta i1$, $\Delta i2$, or $\Delta i3$) may be different (e.g., varied) when the current value is adjusted (either increased or decreased), the adjusted current amount may include a variable current amount.

Figure 25:
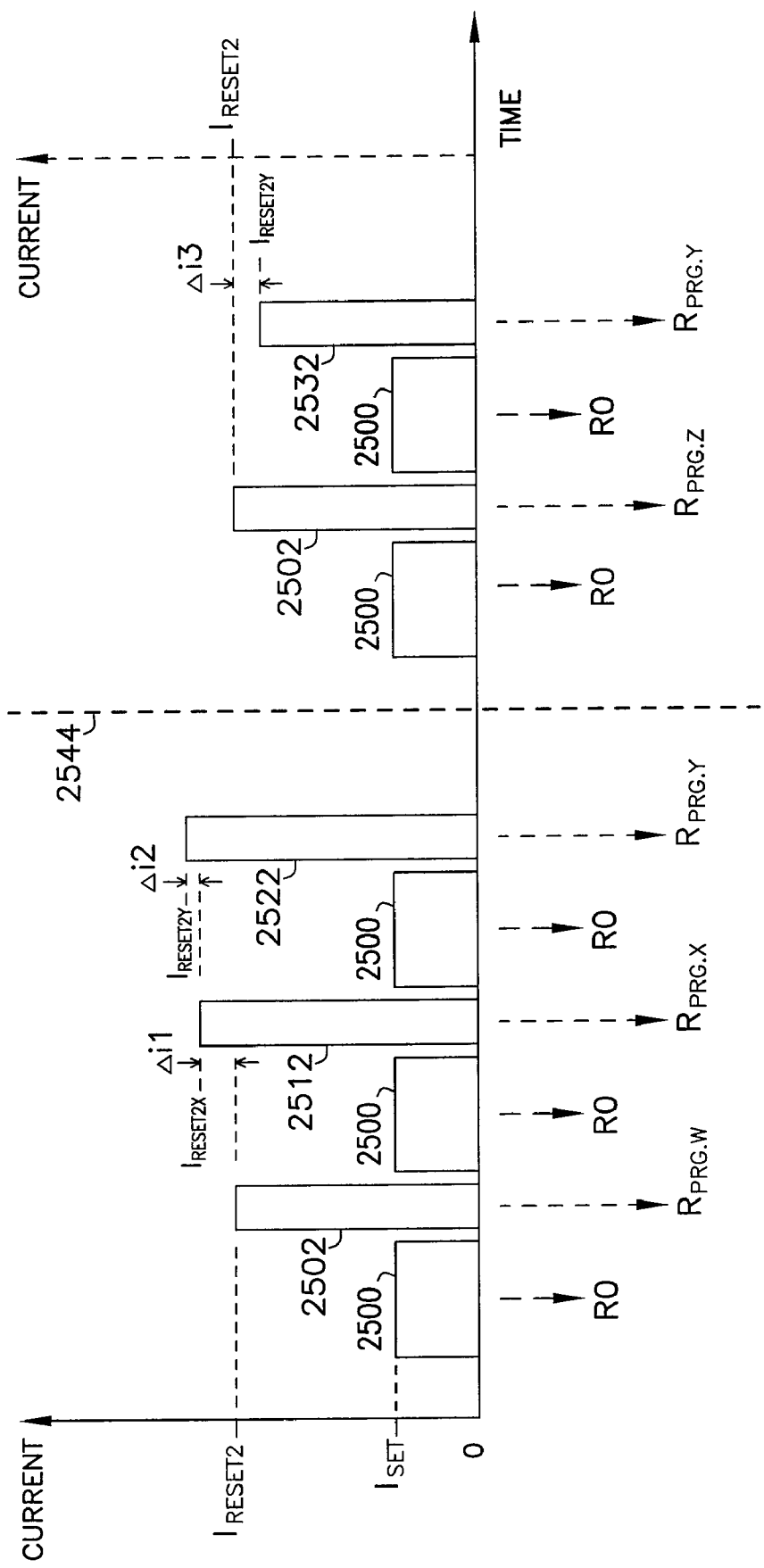
FIG. 25 is a graph showing various adjusted current values used during the example programming operation associated with FIG. 24.

FIG. 25 is a graph showing various adjusted current values used during the example programming operation associated with FIG. 24. FIG. 25 shows two example situations that may occur during programming, one situation on the left side of line 2544 and another situation on the right side of line 2544. As shown on the left side of line 2544 in FIG. 25, the programming operation may initially use a signal with a pulse 2502 having an amplitude value corresponding to current value $I_{RESET2}$. Then, the programming operation may successively adjust the amplitude of pulse 2502 to obtain adjusted pulses 2512 and 2522 of the signal with the adjusted amplitude values corresponding to adjusted current values $I_{RESET2W}$ and $I_{RESET2X}$, respectively. The programming operation may use these adjusted current values and repeat the programming until the programmed resistance value (e.g., $R_{PRG.Y}$ in FIG. 24) is within the $R_{TAR}$ range (FIG. 24). In the situation on the right side of line 2544 in FIG. 25, the programming operation may initially use a signal with a pulse 2502 having an amplitude value corresponding to current value $I_{RESET2}$ and then successively adjust the amplitude of pulse 2502 to obtain at least one adjusted pulse, such as pulse 2532 of the signal, with the adjusted amplitude value corresponding to an adjusted current value, such as $I_{RESET2Y}$. The programming operation may use the adjusted current value and repeat the programming until the programmed resistance value (e.g., $R_{RPG.Y}$) is within the $R_{TAR}$ range (FIG. 24). Current values such as $I_{RESET2}$, $I_{RESET2X}$, and $I_{RESET2Y}$ may be called programming parameter values.

Further, as shown in FIG. 25, the programming operation may use a signal 2500 having a pulse amplitude value corresponding to current value $I_{SET}$ to program (e.g., set) the memory cell to an initial resistance value (e.g., R0) before each time the programming operation programs (e.g., resets) the memory cell, which results in the memory cell having a programmed resistance value $R_{RPG.W}$, $R_{RPG.X}$, or $R_{RPG.Z}$.

The description above with reference to FIG. 20 through FIG. 25 describes examples in which a programming operation may adjust the amplitude of a pulse of a signal to program a memory cell until a programmed resistance of the memory cell is within a target resistance value range.

Alternatively, to program the memory cell, the programming operation may hold the amplitude value of the pulse at the same or substantially the same value and adjust a transition time value of the pulse (instead of adjusting the amplitude of the pulse or in addition to adjusting the amplitude of the pulse) until the programmed resistance of the memory cell is within the target resistance value range.

Figure 26:
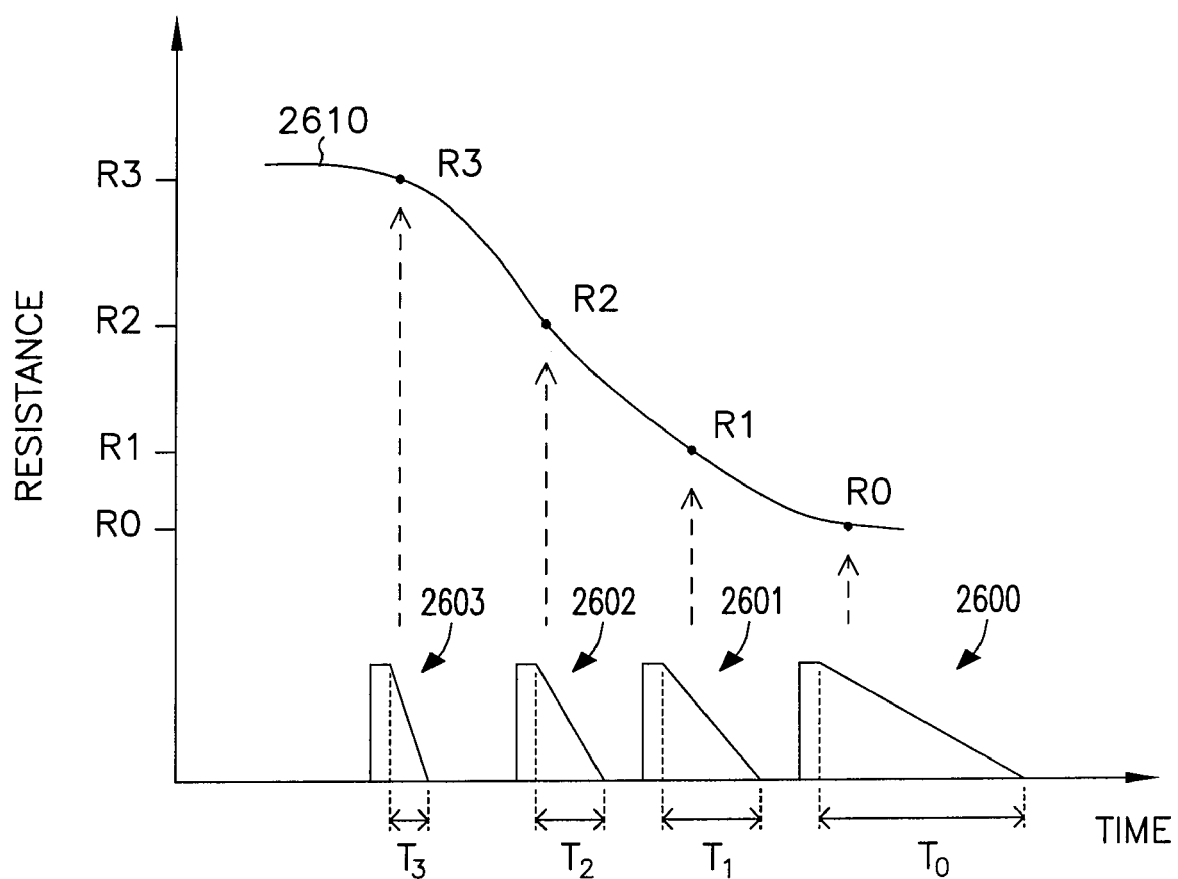
FIG. 26 is a graph of a curve showing a relationship between resistance values and transition time values for use as target values during a programming operation according to an embodiment of the invention.

FIG. 26 is a graph of a curve 2610 showing a relationship between resistance values R0, R1, R2, and R3 and transition time values $T_0$, $T_1$, $T_2$, and $T_3$ for use as target values during a programming operation according to an embodiment of the invention. As shown in FIG. 26, each of transition time values $T_0$, $T_1$, $T_2$, and $T_3$ may represent a pulse fall time value of a pulse. The device associated with FIG. 26 may characterize (e.g., program and then read) selected memory cells to determine the relationship (e.g., resistance values R0, R1, R2, and R3 and pulse fall time values) represented by curve 2610 and then store (e.g., in the form of values in a table) the relationship in a storage area of the device. As shown in FIG. 26, the programming operation may use a signal with a pulse 2600 to program the memory cell to resistance value R0, and different signals with different pulses 2601, 2602, and 2603 with transition time values (in time unit such as nanosecond) $T_1$, $T_2$, and $T_3$ to program the memory cell to resistance value R1, R2, or R3, respectively. Transition time value $T_0$ of pulse 2600 may be greater than each of transition time values $T_1$, $T_2$, and $T_3$ to program the memory cell to a lower resistance value R0. As shown in FIG. 26, pulses 2600, 2601, 2602, and 2603 may have the same or substantially the same amplitude value (e.g., same current value). Each of transition time values $T_0$, $T_1$, $T_2$, and $T_3$ may be called a target transition time value (occasionally referred to as $T_{TAR}$). During a programming operation (e.g., after the initialization), the programming operation may select one of transition time values $T_0$, $T_1$, $T_2$, and $T_3$ to be $T_{TAR}$, depending on which one the resistance values R0, R1, R2, and R3 is determined to be $R_{TAR}$. During programming, the programming operation may successively adjust $T_{TAR}$ to program the memory cell until the memory cell has a resistance value equal to $R_{TAR}$ or to a value within an acceptable range of $R_{TAR}$.

Figure 27:
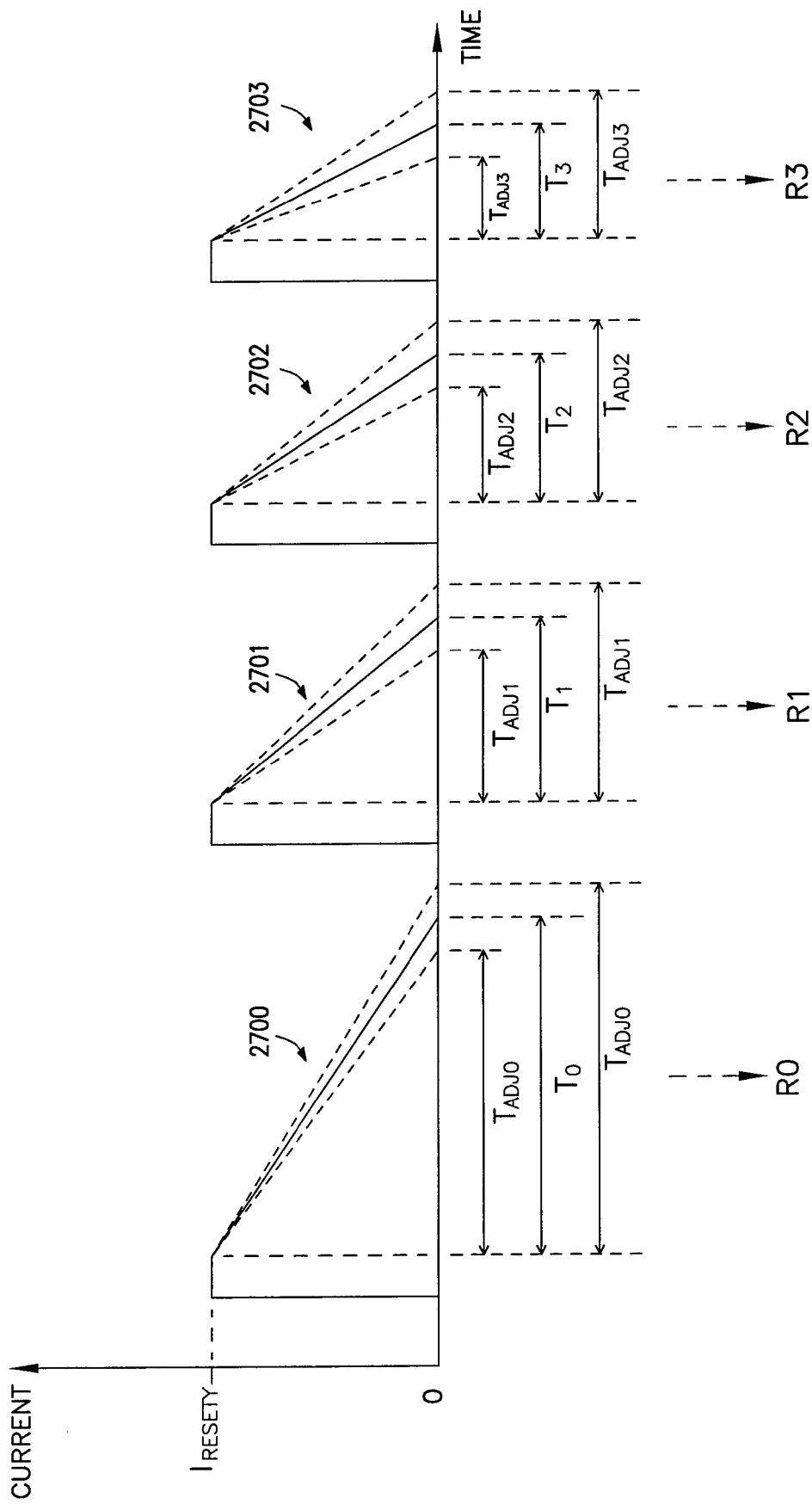
FIG. 27 is a graph showing different signals with pulses having adjustable transition time values used during a programming operation according to an embodiment of the invention.

FIG. 27 is a graph showing different signals with pulses 2700, 2701, 2702, and 2703 having adjustable transition time values $T_0$, $T_1$, $T_2$, and $T_3$ used during a programming operation according to an embodiment of the invention. A programming operation may use pulses 2700, 2701, 2702, and 2703 to cause a memory cell to have corresponding resistance values R0, R1, R2, and R3, respectively. As shown in FIG. 27, pulses 2700, 2701, 2702, and 2703 may have the same or substantially the same amplitude value (e.g., same current value $I_{RESET7}$) Transition time values $T_0$, $T_1$, $T_2$, and $T_3$ of FIG. 27 may correspond to those of FIG. 26. Alternatively, pulse 2700 of FIG. 27 may have a square (or substantially square) wave shape and an amplitude value (e.g., current value $I_{SET}$) that is less than the amplitude of each of pulses 2701, 2702, and 2703 with sufficient pulse width to fully set the memory cell.

As shown in FIG. 27, the programming operation may adjust transition time values $T_0$, $T_1$, $T_2$, and $T_3$ to obtain adjusted transition time values $T_{ADJ0}$, $T_{ADJ1}$, $T_{ADJ2}$, and $T_{ADJ3}$, respectively. Each of adjusted transition time values $T_{ADJ0}$, $T_{ADJ1}$, $T_{ADJ2}$, and $T_{ADJ3}$ may include a value that is less than or greater than its corresponding transition time value by an adjusted time amount. For example, as shown in FIG. 27, adjusted transition time value $T_{ADJ2}$ may be less than or greater than transition time value $T_2$. Depending on the value of $R_{TAR}$, the programming operation may select one of transition time values $T_1$, $T_2$, and $T_3$ as an initial target transition time value and may adjust the selected initial target transition time value during programming to program the memory cell until its programmed resistance value $R_{PRG}$ is equal to $R_{TAR}$ (e.g., R1, R2, or R3) or is within an acceptable range of $R_{TAR}$.

Figure 28:
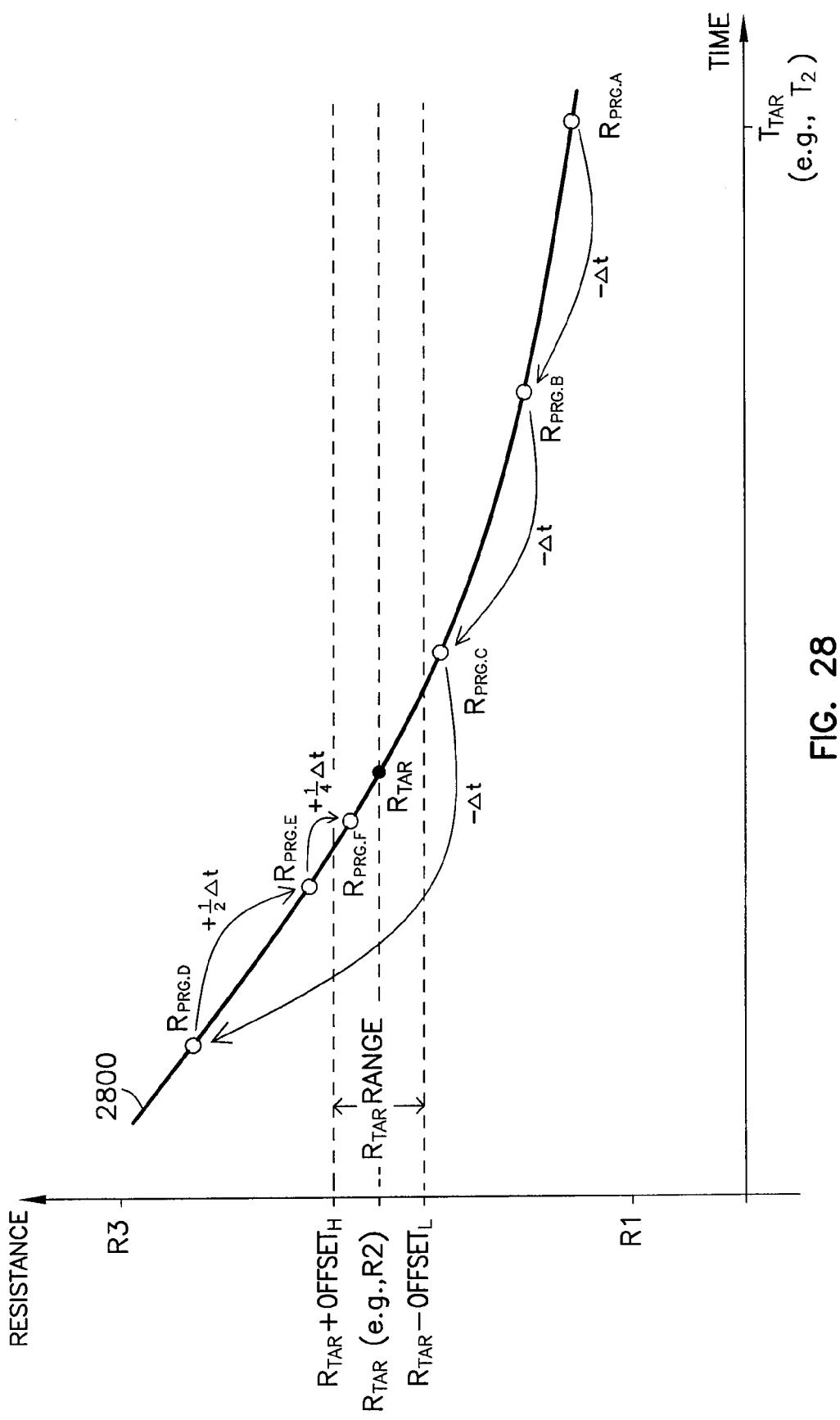
FIG. 28 is a graph showing resistance versus transition time during an example programming operation according to an embodiment of the invention.

FIG. 28 is a graph showing resistance versus transition time during an example programming operation according to an embodiment of the invention. The example programming operation associated with FIG. 28 may include activities similar to the example programming operation associated with FIG. 22 with some exceptions. As describe above, the programming operation associated with FIG. 22 may successively increase the current value (e.g., $I_{RESET2}$) when $R_{PRG}$ is outside the $R_{TAR}$ range and less than $R_{TAR}$ and decrease the current value when $R_{PRG}$ is outside the $R_{TAR}$ range and greater than $R_{TAR}$. In FIG. 28, however, the programming operation may successively decrease the transition time value (e.g., $T_2$) when $R_{PRG}$ is outside the $R_{TAR}$ range and less than $R_{TAR}$ and increase the transition time value when $R_{PRG}$ is outside the $R_{TAR}$ range and greater than $R_{TAR}$.

In FIG. 28, $R_{TAR}$, $R_{TAR}$+OFFSET$_H$, $R_{TAR}$−OFFSET$_L$, and $R_{TAR}$ range may be similar to or identical to those described above with reference to FIG. 22. For the purposes of describing FIG. 28, $R_{TAR}$ is assumed to be resistance value R2. $R_{PRG.A}$, $R_{PRG.B}$, $R_{PRG.C}$, $R_{PRG.D}$, $R_{PRG.E}$, and $R_{PRG.F}$ may represent various programmed resistance values that the memory cell may have during various repeated programming. The programming operation may repeat programming (e.g., resetting) the memory cell more than one times in an attempt to cause the programmed resistance value to be within the $R_{TAR}$ range. In the example of FIG. 28, since $R_{TAR}$ is assumed to be resistance value R2, the programming operation may use a signal having a pulse with an initial target transition time value $T_{TAR}=T_2$ to program the memory cell so that $R_{TAR}$ (or R2 in this example) may be programmed into the memory cell.

The programming operation associated with FIG. 28 may include the following activities. The programming operation may initially use a transition time value (e.g., $T_2$) to program the memory cell. If the programming resistance value $R_{PRG}$ is outside the $R_{TAR}$ range, then the programming operation may successively adjust the transition time value (e.g., by increasing or decreasing the transition time value by an adjusted time amount such as $\Delta t$, /1;2 $\Delta t$, ¼ $\Delta t$, ⅛ $\Delta t$, or 1/16 $\Delta t$) to obtain different adjusted transition time values. Adjusted time amounts such as $\Delta t$, ½$\Delta t$, ¼$\Delta t$, ⅛$\Delta t$, and 1/16 $\Delta t$ may be called adjusted parameter amounts. After each adjustment, the programming operation may use the adjusted transition time values and repeat programming the memory cell until $R_{PRG}$ is within the $R_{TAR}$ range.

For example, in FIG. 28, after being programmed using a transition time value $T_2$, the memory cell may have $R_{PRG.A}$, which is outside the $R_{TAR}$ range and less than $R_{TAR}$. Thus, the programming operation may adjust transition time value $T_2$ and repeat the programming until the memory cell has the programmed resistance value (e.g., $R_{PRG.F}$) that is within the $R_{TAR}$ range.

As shown in FIG. 28, the memory cell may have $R_{PRG.A}$, which is outside the $R_{TAR}$ range, after being programmed using an initial transition time value $T_2$. To repeat programming, the programming operation may adjust transition time value $T_2$ by decreasing $T_2$ by $\Delta t$, and then repeat programming the memory cell using an adjusted transition time value $T_{ADJ2B}=T_2-\Delta t$.

After programming using $T_{ADJ2B}$, the memory cell may have $R_{PRG.B}$, which is still outside the $R_{TAR}$ range and less than $R_{TAR}$. Thus, the programming operation may adjust $T_{ADJ2B}$ by decreasing $T_{ADJ2B}$ by $\Delta t$, and then repeat programming the memory cell using an adjusted transition time value $T_{ADJ2C}=T_{ADJ2B}-\Delta t$. The programming operation may keep decreasing the current value by $\Delta i$ until the programmed resistance value is either within the $R_{TAR}$ range (then the programming operation may finish programming the memory cell) or outside the $R_{TAR}$ range but greater than $R_{TAR}$ (then the programming operation may continue but with an adjusted current amount less than $\Delta i$).

After programming using $T_{ADJ2C}$, the memory cell may have $R_{PRG.C}$, which is still outside the $R_{TAR}$ range and less than $R_{TAR}$. Thus, the programming operation may adjust $T_{ADJ2C}$ by decreasing $T_{ADJ2C}$ by $\Delta t$, and then repeat programming the memory cell using an adjusted transition time value $T_{ADJ2D} = T_{ADJ2C} - \Delta t$.

After programming using $T_{ADJ2D}$, the memory cell may have $R_{PRG.D}$, which is still outside the $R_{TAR}$ range but greater than $R_{TAR}$. Thus, the programming operation may adjust $T_{ADJ2D}$ by increasing $T_{ADJ2D}$ by ½ $\Delta t$, and then repeat programming the memory cell using an adjusted transition time value $T_{ADJ2E} = T_{ADJ2D} + ½ \Delta t$.

After programming using $T_{ADJ2E}$, the memory cell may have $R_{PRG.E}$, which is still outside the $R_{TAR}$ range and greater than $R_{TAR}$. Thus, the programming operation may adjust $T_{ADJ2E}$ by increasing $T_{ADJ2E}$ by ¼ $\Delta t$, and then repeat program the memory cell using an adjusted transition time value $T_{ADJ2F} = T_{ADJ2E} + ¼ \Delta t$. After programming using $T_{ADJ2F}$, the memory cell may have $R_{PRG.F}$, which is within the $R_{TAR}$ range. Since $R_{PRG.F}$ is within the $R_{TAR}$ range, the programming operation may finish programming the memory cell.

As described above, the programming operation may decrease the previous transition time value by an adjusted transition time amount (e.g., $\Delta t$) if after being programmed, the memory cell has a programmed resistance value (e.g., $R_{PRG.A}$, $R_{PRG.B}$, or $R_{PRG.C}$) that is outside the $R_{TAR}$ range and less than $R_{TAR}$. In the opposite, the programming operation may increase the previous transition time value by an adjusted transition time amount (e.g., ½ $\Delta t$ or ¼ $\Delta t$) if after being programmed, the memory cell has a resistance value (e.g., $R_{PRG.D}$ or $R_{PRG.E}$) that is outside the $R_{TAR}$ range and greater than $R_{TAR}$. Since the adjusted transition time amount (e.g., $\Delta t$, ½ $\Delta t$, ¼ $\Delta t$, ⅛ $\Delta t$, or 1/16 $\Delta t$) may be different (e.g., varied) when the transition time is adjusted, the adjusted transition time amount may include a variable transition time amount.

In FIG. 28, $\Delta t$ may be called a selected time amount. The device associated with FIG. 28 may select the value of $\Delta t$ to be any appropriate value. However, to improve the chance of a programmed resistance to be within the $R_{TAR}$ range or to reduce the number of repeated programming, for example, the device may select the value of $\Delta t$ based on a difference in values between two adjacent transition time values (e.g., $T_1$, $T_2$, and $T_3$) from a resistance value versus transition time value curve, such as curve 2800 of FIG. 28. For example, the device may select the value of $\Delta t$ to be equal to the difference between $T_{TAR}+\text{OFFSET}''_H$ and $T_{TAR}-\text{OFFSET}''_L$ or less than (e.g., one-half of) the difference between $T_{TAR}+\text{OFFSET}''_H$ and $T_{TAR}+\text{OFFSET}''_L$. $T_{TAR}+\text{OFFSET}''_H$ and $T_{TAR}-\text{OFFSET}''_L$ may include transition time values of the pulses that are used to obtain $R_{TAR}+\text{OFFSET}_H$ and $R_{TAR}-\text{OFFSET}_L$, respectively.

Figure 29:
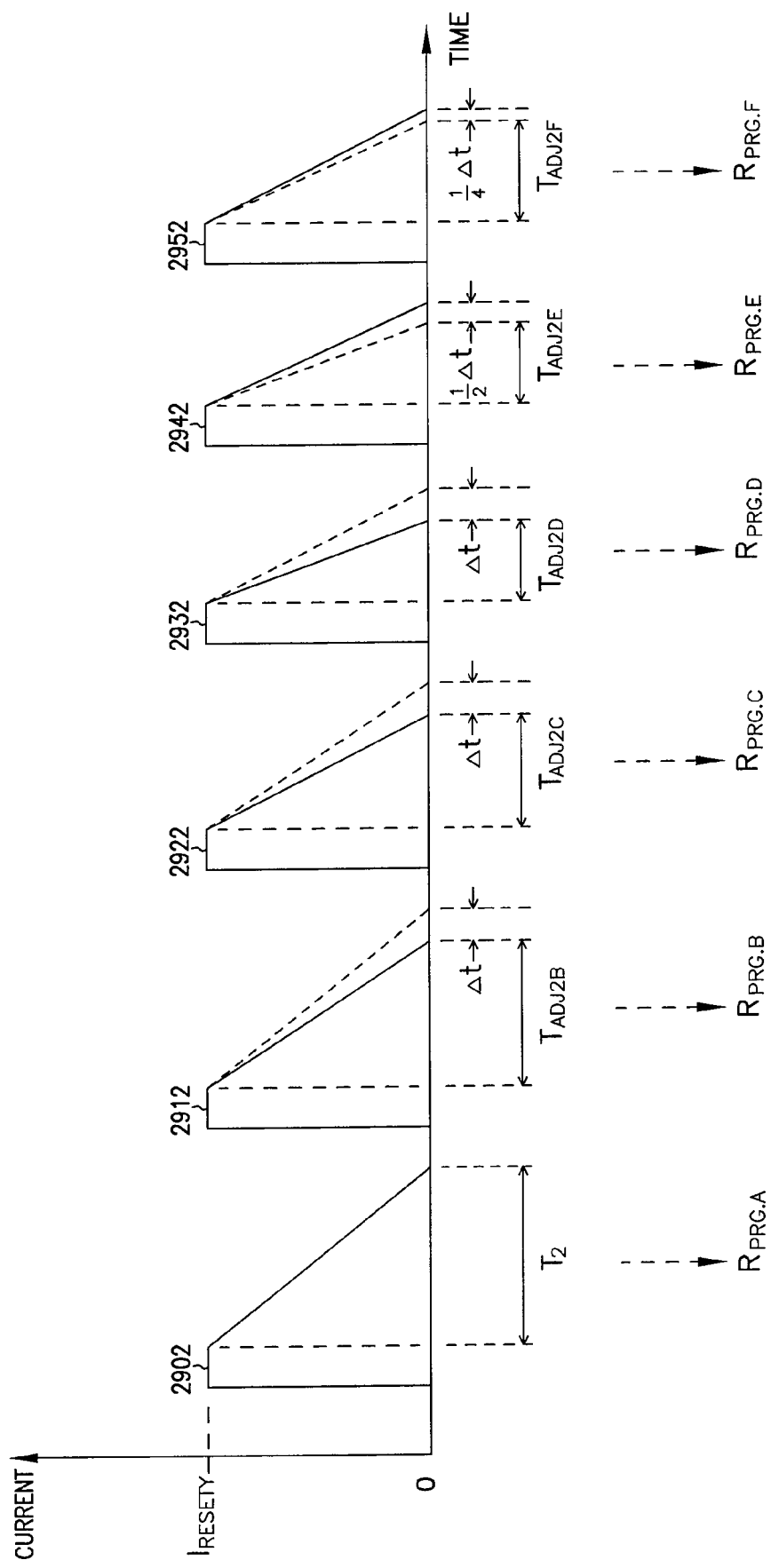
FIG. 29 is a graph showing various adjusted transition time values used based on an initial target transition time value used during the example programming operation associated with FIG. 28.

FIG. 29 is a graph showing various adjusted transition time values based on an initial target transition time value used during the example programming operation associated with FIG. 28. As shown in FIG. 29, the programming operation may initially use a signal with a pulse 2902 having an amplitude value corresponding to current value $I_{RESETT}$, and a transition time value $T_2$ to program the memory cell and successively adjust the transition time $T_2$ of pulse 2902 to obtain adjusted pulses 2912, 2922, 2932, 2942, and 2952 of the signal with the adjusted transition time values $T_{ADJ2B}$, $T_{ADJ2C}$, $T_{ADJ2D}$, $T_{ADJ2E}$, and $T_{ADJ2F}$, respectively. Transition time values such as $T_2$, $T_{ADJ2B}$, $T_{ADJ2C}$, $T_{ADJ2D}$, $T_{ADJ2E}$, and $T_{ADJ2F}$ may be called programming parameter values. The programming operation may then use these programming parameter values and repeat the programming until the programmed resistance value (e.g., $R_{PRG.Y}$ in FIG. 28) is within the $R_{TAR}$ range (FIG. 28).

In the description herein, the features shown in drawings are not scaled. Some drawings may exaggerate or contrast the relationship among the features shown in the drawings for ease of illustrating the embodiments herein. For example, FIG. 22 shows the $R_{TAR}$ range being greater than two immediate adjacent programmed resistance values (e.g., $R_{PRG.B}$ and $R_{PRG.C}$). However, the $R_{TAR}$ range may be less than the difference between two immediate adjacent programmed resistance values. Further, some examples herein may use some specific number of programmed resistance values (e.g., $R_{PRG.A}$, $R_{PRG.B}$, $R_{PRG.C}$, $R_{PRG.D}$, $R_{PRG.E}$, and $R_{PRG.F}$ in FIG. 22, FIG. 23, or FIG. 28, or $R_{PRG.W}$, $R_{PRG.X}$, $R_{PRG.Y}$, and $R_{PRG.Z}$ in FIG. 24) while programming a memory cell to a target resistance value. The number of programmed resistance values, however, may be less than or more than the number used in these examples. For example, in FIG. 22 and FIG. 28, the resistance value of the memory cell may jump from $R_{PRG.A}$ to $R_{PRG.D}$ after the programming operation adjusts the current amount by $+\Delta i$. In another example, $R_{PRG.A}$ (FIG. 22 or FIG. 28), $R_{PRG.W}$ (FIG. 24) may be within the $R_{TAR}$ range after one programming such that no repeated programming and adjustment is performed. Thus, during a programming operation, the programmed resistance value of the memory cell may converge to the $R_{TAR}$ range quicker than the examples described herein.

The above description with reference to FIG. 20 through FIG. 29 describes some example programming operations of a device including activities to adjust an amplitude value (e.g., current value) or a transition time value (e.g., pulse fall time value) of a pulse to program (e.g., reset) a memory cell. The description below with reference to FIG. 30 through FIG. 34 describes methods of operating a device that may include some or all activities of the above example programming operations.

Figure 30:
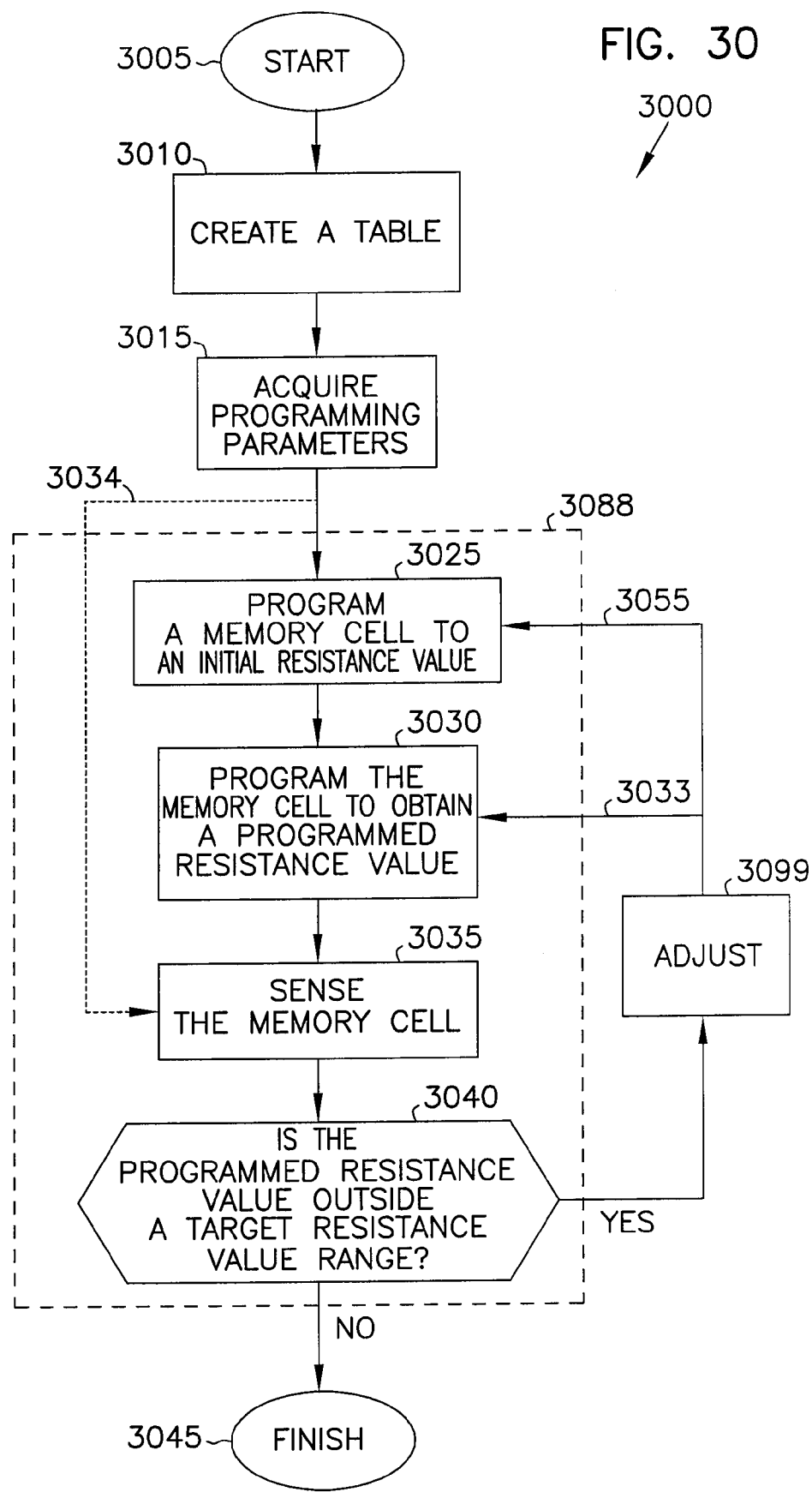
FIG. 30 is a flow diagram showing methods of operating a device according to an embodiment of the invention.

FIG. 30 is a flow diagram showing methods 3000 of operating a device according to an embodiment of the invention. Methods 3000 may start at activity 3005, which may include turning on (e.g., powering up) or supplying power to the device.

Figure 31:
FIG. 31 is a table showing a relationship between target resistance values and corresponding target current values for the methods associated with FIG. 30.

Activity 3010 may include creating a table that a programming operation of the device may use during programming at least one memory cell of the device. Activity 3010 may create the table during an interval such as during device initialization without receiving a command (e.g., programming or read command) from an external device, such as a processor or a memory controller. The table may include programming parameter values and values representing characterization of the memory cells. For example, activity 3010 may include creating a table such as a table 3100 (FIG. 31). As shown in FIG. 31, table 3100 may include values associated with a relationship between target resistance values R0, Ra, R1, Rb, R2, Rc, R3, and Rd and corresponding current values $I_{SET}$, Ia, $I_{RESET1}$, Ib, $I_{RESET2}$, Ic, $I_{RESET3}$, and Id. Table 3100 may also include values associated with relationships between values of information (e.g., "00", "01", "10", and "11") and resistance values R0, R1, R2, and R3. The device, however, may exclude the relationship between resistance values R0, R1, R2, and R3 and the values of information (e.g., "00", "01", "10", and "11") from table 3100 and store the relationship in a location separate from table 3100. For simplicity, table 3100 includes an example of four resistance values, four current values, and four information values to indicate that each memory of the device may be configured to store four logic states (which may also be called levels), representing two bits of information. Table 3100, however, may include other numbers (e.g., eight, sixteen, or other) of resistance values, current values, and information values when the memory cell is configured to store other number of logic states representing other number of bits (e.g., three or four) of information.

To create the table 3100, activity 3010 may include programming (e.g., during device initialization) some selected memory cells of the memory device using signals with different amplitude values corresponding to different current values (e.g., $I_{SET}$, Ia, $I_{RESET1}$, Ib, $I_{RESET2}$, Ic, $I_{RESET3}$, and Id). A different amplitude value used to program a selected memory cell may result in the selected memory cell having a different resistance value. After the selected memory cells are programmed, activity 3010 may read the selected memory cells and measure their resistance values. Then, activity 3010 may store in table 3100 the measured resistance values (e.g., R0, Ra, R1, Rb, R2, Rc, R3, and Rd) and the corresponding current values (e.g., $I_{SET}$, Ia, $I_{RESET1}$, Ib, $I_{RESET2}$, Ic, $I_{RESET3}$, and Id) that have been used to program the selected memory cells to the measured resistance values. Methods 3000 may use one of the current values in table 3100 or extrapolated values based on table 3100 as an initial (e.g., target) current value (e.g., $I_{SET}$, $I_{RESET1}$, $I_{RESET2}$, or $I_{RESET3}$) to program a memory cell during a programming operation, e.g., a programming operation in response to a programming command provided from a device such as a processor or a memory controller.

Figure 32:
FIG. 32 is a table showing a relationship between target resistance values and corresponding target transition time values for the methods associated with FIG. 30.

Alternatively or additionally, activity 3010 of FIG. 30 may include creating a table such as a table 3200 of FIG. 32. As shown in FIG. 32, table 3200 may include relationships between target resistance values R0, Ra, R1, Rb, R2, Rc, R3, and Rd and corresponding transition time values $T_0$, Ta, $T_1$, Tb, $T_2$, Tc, $T_3$, and Td of a pulse of signals that the programming operation used to program the memory cells to resistance values such as R0, Ra, R1, Rb, R2, Rc, R3, and Rd. Table 3200 may also include a relationship between values of information (e.g., "00", "01", "10", and "11") and resistance values R0, R1, R2, and R3. The device, however, may exclude the relationship between resistance values R0, R1, R2, and R3 and the values of information (e.g., "00", "01", "10", and "11") from table 3200 and store the relationship in a location separate from table 3200.

To create the table 3200, activity 3010 may include programming (e.g., during device initialization) some selected memory cells of the memory device using signals with different transition time values (e.g., $T_0$, Ta, $T_1$, Tb, $T_2$, Tc, $T_3$, and Td). After the selected memory cells are programmed, activity 3010 may read the selected memory cells and measure the resistance values of the memory cells. Then, activity 3010 may store in table 3200 the measured resistance values (e.g., R0, Ra, R1, Rb, R2, Rc, R3, and Rd) and the corresponding transition time values (e.g., $T_0$, Ta, $T_1$, Tb, $T_2$, Tc, $T_3$, and Td) that have been used to program the selected memory cells. Methods 3000 may use one of the transition time values in table 3200 or extrapolated values based on table 3200 as an initial (e.g., target) transition time value (e.g., $T_0$, $T_1$, $T_2$, or $T_3$) to program a memory cell during a programming operation, e.g., a programming operation in response to a programming command provided from a device such as a processor or a memory controller.

Each of table 3100 and 3200 may include hardware, firmware, software, or a combination thereof. The device used by methods 3000 may store the table created by activity 3010 in a storage area similar to or identical to storage area 144 of FIG. 1. Methods 3000 of FIG. 30 may use either table 3100 or 3200 to program memory cells of the device. After activity 3010 creates the table (e.g. table 3100 or 3200), method 3000 may continue with activity 3015.

Activity 3015 may include acquiring programming parameter values used to program the memory cell. For example, based on a value of information to be programmed to the memory cell, acquiring programming parameters in activity 3015 may include accessing some locations of the device including a table, such as table 3100 or 3200, to determine a target resistance value $R_{TAR}$, and either a target amplitude value (e.g., $I_{TAR}$) or a target transition time value (e.g., $T_{TAR}$) based on the target resistance value. Activity 3015 may also include determining a target resistance value range ($R_{TAR}$ range) based on $R_{TAR}$. For example, activity 3015 may include determining upper and lower resistance values of the $R_{TAR}$ range based on $R_{TAR}$ and offset values such as $OFFSET_H$ and $OFFSET_L$ similar or identical to those described above with reference to FIG. 20 through FIG. 29. A storage area of the device may store the offset values.

Activity 3025 in FIG. 30 may program the memory cell to cause it to have an initial resistance value such as a "set" resistance value represented by R0 of FIG. 23, FIG. 25, or FIG. 29. Activity 3025 may include the set activities as described above with reference to FIG. 18 and FIG. 19 to change the material of a programmable portion of the memory cell to a crystalline phase (e.g., crystalline phase 613 of FIG. 6).

Activity 3030 may include programming the memory cell to cause it to have a programmed resistance value $R_{PRG}$ equal to $R_{TAR}$ or within the $R_{TAR}$ range. Activity 3030 may use a signal with at least one pulse, the pulse may have an amplitude value, or transition time value, or both, similar to or identical to those described above with reference to FIG. 20 through FIG. 29. In activity 3030, programmed resistance value $R_{PRG}$ may have a value similar to or identical to one or more of $R_{PRG.A}$, $R_{PRG.B}$, $R_{PRG.C}$, $R_{PRG.D}$, $R_{PRG.E}$, and $R_{PRG.F}$ of FIG. 22 and FIG. 28 or one or more of $R_{PRG.W}$, $R_{PRG.X}$, $R_{PRG.Y}$, and $R_{PRG.Z}$ of FIG. 24.

Activity 3035 of FIG. 30 may include sensing the memory cell to obtain a resistance value (e.g., the resistance value programmed in activity 3025 or 3030, or both). Methods 3000 may, however, include skipping activities 3025 and 3030 (indicated by activity 3034) and may sense the memory cell to obtain a resistance value without programming the memory cell in activities 3025 and 3030. The memory cell may already have an existing resistance value (before activities 3025 or 3030 are performed), which may be within the $R_{TAR}$ range. Thus, skipping programming activities 3025 and 3030 may avoid an additional programming of the memory cell, thereby improving the life of the device. In this description, reading a memory cell is one form of sensing the memory cell.

Activity 3040 may include determining whether the programmed resistance value of the memory cell is outside the $R_{TAR}$ range. If the programmed resistance value is not outside the $R_{TAR}$ range (i.e., within the $R_{TAR}$ range), then methods 3000 may continue with activity 3045 to finish the programming. If the programmed resistance value is outside the $R_{TAR}$ range, then methods 3000 may continue to activity 3099. If methods 3000 skip activities 3025 and 3030, activity 3040 may include determining whether the existing resistance value of the memory cell is outside the $R_{TAR}$ range. If the existing resistance value is not outside the $R_{TAR}$ range (i.e., within the $R_{TAR}$ range), then methods 3000 may continue with activity 3045 to finish the programming. If the existing resistance value is outside the $R_{TAR}$ range, then methods 3000 may continue to activity 3099.

Activity 3099 may include adjusting one or both of the amplitude value of the pulse and the transition time value of the pulse used in activity 3099. For example, activity 3099 may include adjusting a current value by an adjusted current amount such as $\Delta i$ (described with reference to FIG. 20 through FIG. 25). Alternatively or additionally, activity 3099 may include adjusting a transition time value by an adjusted time amount such as $\Delta t$ (described with reference to FIG. 26 through FIG. 29). Methods 3000 may repeat some or all of activities 3088 and activity 3099 until programmed resistance value $R_{PRG}$ of the memory cell is within the $R_{TAR}$ range. For example, if methods 3000 uses table 3100 (resistance values and amplitude current values) to program the memory cell in activity 3088, then methods 3000 may adjust the current value in activity 3099 and repeat activities 3025, 3030, 3035, and 3040 (indicated by repeated activity 3055). In another example, if methods 3000 uses table 3200 (resistance values and transition time values) to program the memory cell in activity 3088, then methods 3000 may adjust the transition time value in activity 3099 and repeat activities 3030, 3035, and 3040 (indicated by activity 3033).

If activities 3025 and 3030 are skipped, and if the resistance value in activity 3040 is outside the $R_{TAR}$ range, methods 3000 may jump from activity 3040 to activity 3025, omitting activity 3099 for one time, because an amplitude value may have not yet been used to program the memory.

Figure 33:
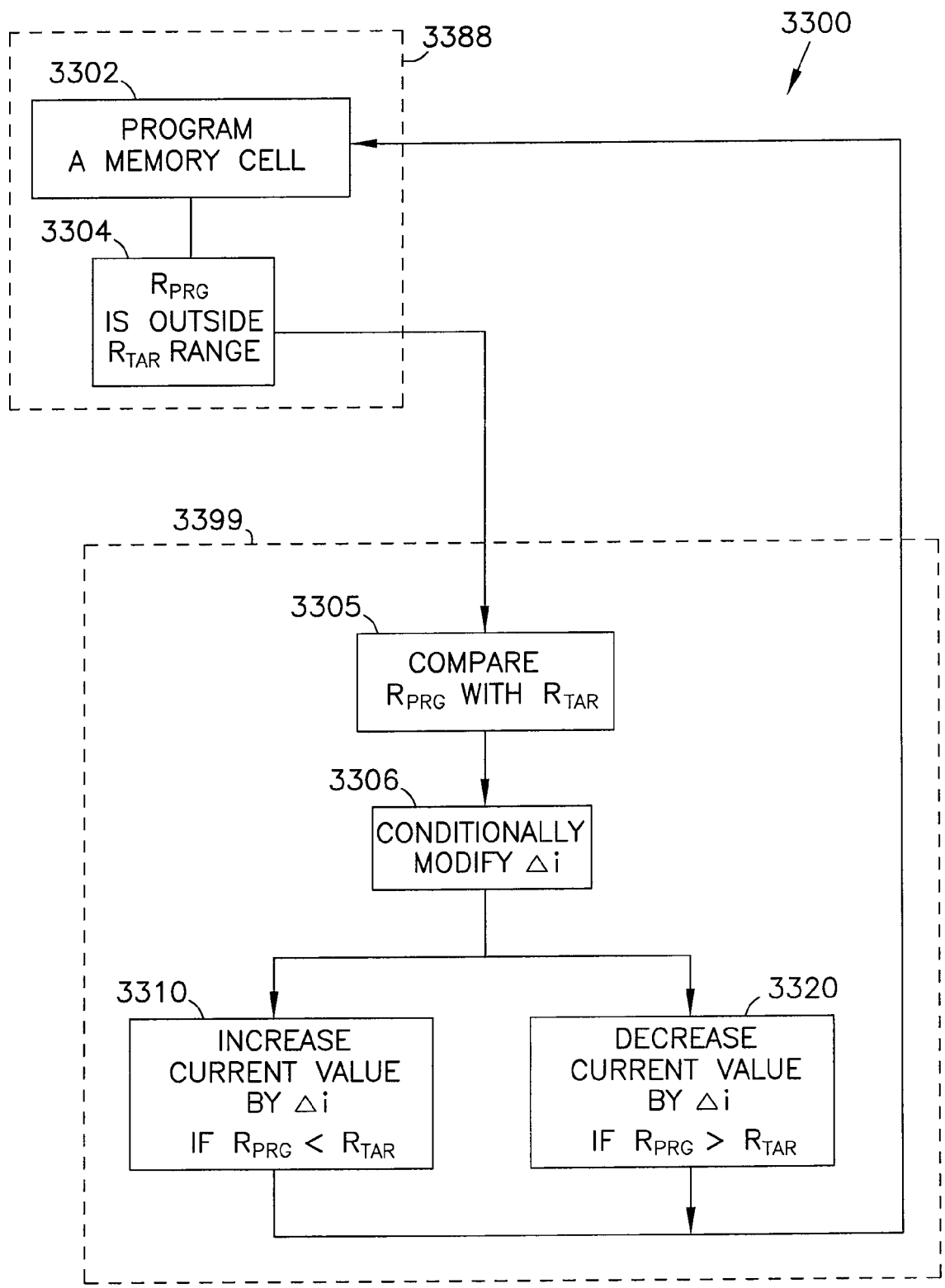
FIG. 33 is a flow diagram showing methods of operating a device including amplitude value adjustment according to an embodiment of the invention.
Figure 34:
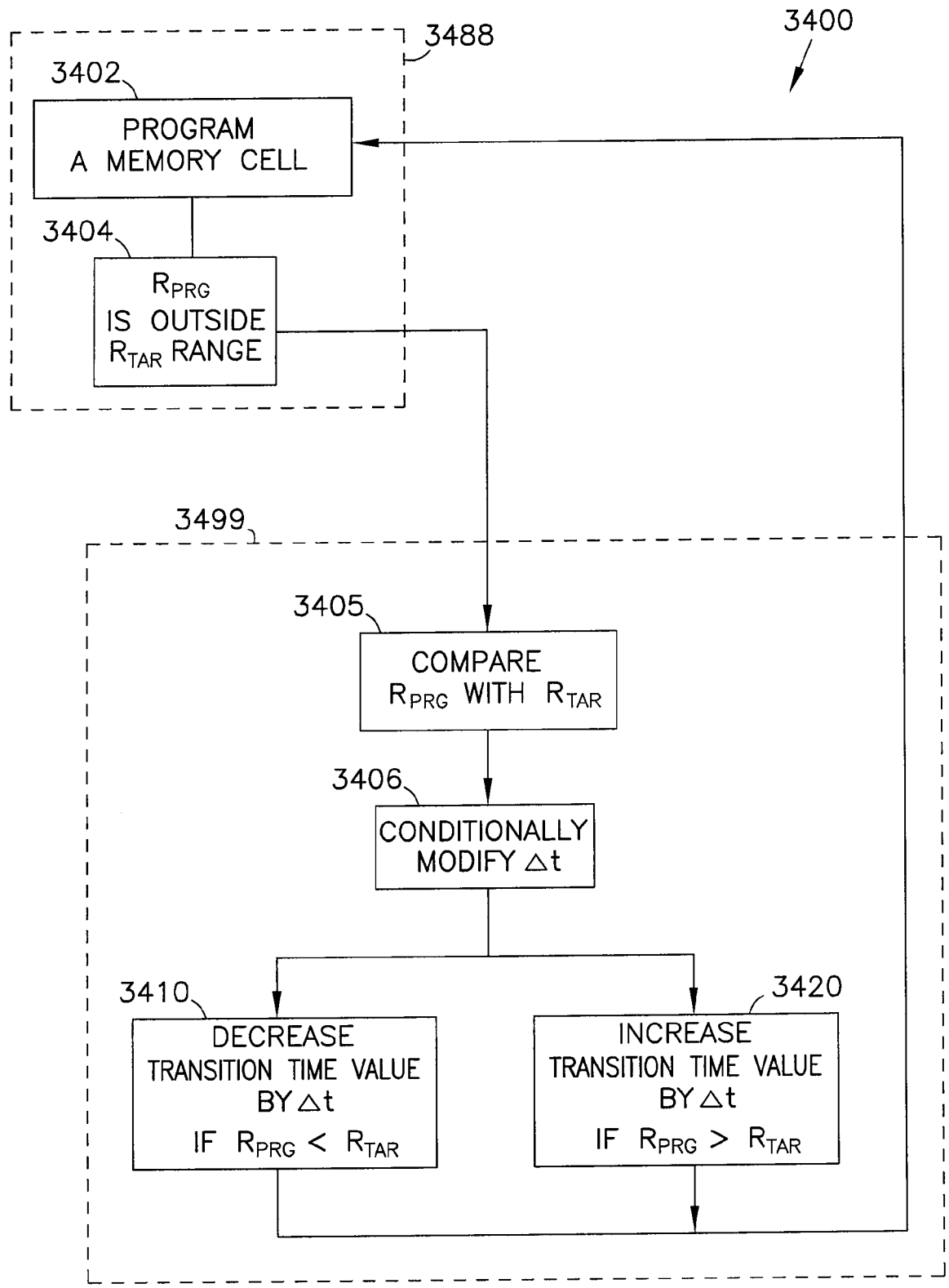
FIG. 34 is a flow diagram showing methods of operating a device including transition time value adjustment according to an embodiment of the invention.

The adjustments performed by activity 3099 may include activities of methods 3300 of FIG. 33 or activities of methods 3400 of FIG. 34.

FIG. 33 is a flow diagram showing methods 3300 of operating a device including amplitude value adjustment according to an embodiment of the invention. Methods 3300 may include activities 3388, which may be similar to identical to activities 3088 of FIG. 30. For example, activities 3388 may include activity 3302 to program a memory cell and activity 3304 to determine whether a programmed resistance value $R_{PRG}$ of the memory cell is outside a resistance target value range ($R_{TAR}$ range). FIG. 33 shows an example where activity 3304 may determine that $R_{PRG}$ is outside the $R_{TAR}$ range. Methods 3300 may also include activities 3399 to adjust the current value used to program the memory cell, and repeat the programming at activity 3302 until $R_{PRG}$ is within the $R_{TAR}$ range.

Methods 3300 may include activity 3305 to compare $R_{PRG}$ with a target resistance value $R_{TAR}$ if $R_{PRG}$ is outside the $R_{TAR}$ range. Based on the comparison, methods 3300 may continue with activity 3306 and either activity 3310 or 3320. Activity 3306 may conditionally modify $\Delta i$ so that appropriate value of $\Delta i$ may be used for activity 3310 or 3320. Activity 3306 is described in more details below. Activity 3310 may include increasing the current value by $\Delta i$ if $R_{PRG}$ is less than $R_{TAR}$. Activity 3320 may include decreasing the current value by $\Delta i$ if $R_{PRG}$ is greater than $R_{TAR}$. The current value may have an initial value corresponding to current value $I_{RESET1}$, $I_{RESET}$, or $I_{RESET3}$ based on a table such as table 3100 of FIG. 31. The $\Delta i$ may have an initial value selected in ways similar to or identical to those described above with reference to FIG. 22.

Activity 3306 may conditionally modify $\Delta i$ such that $\Delta i$ used in activity 3310 or 3320 may remain at the same value (e.g., a value equal to a previous value of $\Delta i$ such as the initial value of $\Delta i$) or may vary, depending on the various values of $R_{PRG}$. During the programming operation, $R_{PRG}$ may have one or more values that are outside the $R_{TAR}$ range and less than $R_{TAR}$ (e.g., value similar to $R_{PRG.A}$ or $R_{PRG.B}$ of FIG. 22) and one or more other values that are outside the $R_{TAR}$ range and greater than $R_{TAR}$ (e.g., value similar to $R_{PRG.C}$, $R_{PRG.D}$, or $R_{PRG.E}$ of FIG. 22). Methods 3300 may store the values of $R_{PRG}$ during the programming operation to allow activity 3306 to conditionally modify $\Delta i$ based on the stored values of $R_{PRG}$, as described below.

Activity 3306 may keep $\Delta i$ at the same value (e.g., a value equal to the initial value of $\Delta i$) if at any time during the programming operation all of the values of $R_{PRG}$ are outside the $R_{TAR}$ range and less than $R_{TAR}$.

Activity 3306 may also keep $\Delta i$ at the same value (e.g., a value equal to the initial value of $\Delta i$) if at any time during the programming operation all of the values of $R_{PRG}$ are outside the $R_{TAR}$ range and greater than $R_{TAR}$.

Activity 3306 may modify $\Delta i$ (e.g., decrease $\Delta i$) if at any time during the programming operation at least one value of $R_{PRG}$ (e.g., value similar to $R_{PRG.A}$ or $R_{PRG.B}$ of FIG. 22) is outside the $R_{TAR}$ range and less than $R_{TAR}$, and at least one value of $R_{PRG}$ (e.g., value similar to $R_{PRG.C}$, $R_{PRG.D}$, or $R_{PRG.E}$ of FIG. 22) is outside the $R_{TAR}$ range and greater than $R_{TAR}$.

Based on the comparison in activity 3305 and the conditional modification of $\Delta i$ in activity 3306, activity 3310 may increase the current value (used for the next programming sequence) by the same initial value of $\Delta i$ if at any time during the programming operation all of the values of $R_{PRG}$ are less than $R_{TAR}$. Activity 3310 may increase the current value by a modified value of $\Delta i$ if at any time during the programming operation at least one value of $R_{PRG}$ is less than $R_{TAR}$, and at least one value of $R_{PRG}$ is greater than $R_{TAR}$.

Based on the comparison in activity 3305 and the conditional modification of $\Delta i$ in activity 3306, activity 3320 may decrease the current value (used for the next programming sequence) by the same initial value of $\Delta i$ if at any time during the programming operation all of the values of $R_{PRG}$ are greater than $R_{TAR}$. Activity 3320 may decrease the current value by a modified value of $\Delta i$ if at any time during the programming operation at least one value of $R_{PRG}$ is less than $R_{TAR}$, and at least one value of $R_{PRG}$ is greater than $R_{TAR}$.

Methods 3300 may modify $\Delta i$ by reducing it by a factor of $(1/2^n)$ where "n" is a real number. Methods 3300 may increase "n" by a non-integer value after each time activity 3306 modifies $\Delta i$ so that the value of $\Delta i$ may be different (e.g., reduced) when methods 3300 increases or decreases the current value. Methods 3300 may also increase "n" by an integer value (1, 2, or 3, or other value) after each time activity 3306 modifies $\Delta i$. For example, "n" may initially be equal to one before activity 3306 modifies $\Delta i$. Methods 3300 may increase "n" by one after each time activity 3306 modifies $\Delta i$. Thus, methods 3300 may increase or decrease an adjusted current value by an adjusted current amount of $1/2$ $\Delta i$ (i.e., $(1/2^1)\Delta i = 1/2$ $\Delta i$) when activity 3306 modifies $\Delta i$ for the first time. Then, method 3300 may increase or decrease other adjusted current values by $(1/2^n)\Delta i$, where "n" is an integer value corresponding to the total number of times that activity 3306 modifies $\Delta i$. Activity 3306 may modify $\Delta i$ in ways similar to or identical to those described above with reference to FIG. 22 and FIG. 23 to get different adjusted current amount such as $1/2$ $\Delta i$, $1/4$ $\Delta i$, $1/8$ $\Delta i$, and $1/16$ $\Delta i$.

Activity 3306 may modify $\Delta i$ using slope calculations if methods 3300 use $\Delta i$ having values similar to or identical to those of $\Delta i1$, $\Delta i2$, and $\Delta i3$ described above with reference to FIG. 24 and FIG. 25.

Methods 3300 may repeat activities 3388 and 3399 until $R_{PRG}$ is within the $R_{TAR}$ range.

FIG. 34 is a flow diagram showing methods 3400 of operating a device including transition time value adjustment according to an embodiment of the invention. Methods 3400 are similar to methods 3300 of FIG. 33 except that methods 3400 may increase or decrease a transition time value (instead of the current value as in FIG. 33) of a pulse. In FIG. 34, methods 3400 may include activities 3488, which may be similar to identical to activities 3088 of FIG. 30. For example, activities 3488 may include activity 3402 to program a memory cell, and activity 3404 to determine whether a programmed resistance value $R_{PRG}$ is outside a resistance target value range ($R_{TAR}$ range). FIG. 34 shows an example where activity 3404 may determine that $R_{PRG}$ is outside the $R_{TAR}$ range. Methods 3400 may also include activities 3499 to adjust the transition time value used to program the memory cell, and repeat the programming at activity 3402 until $R_{PRG}$ is within the $R_{TAR}$ range.

Methods 3400 may include activity 3405 to compare $R_{PRG}$ with a target resistance value $R_{TAR}$ if $R_{PRG}$ is outside the $R_{TAR}$ range. Based on the comparison, methods 3400 may continue with activity 3406 and either activity 3410 or 3420. Activity 3406 may conditionally modify Δt so that appropriate value of Δt may be used for activity 3410 or 3420. Activity 3406 is described in more details below. Activity 3410 may include decreasing the transition time value by Δt if $R_{PRG}$ is less than $R_{TAR}$. Activity 3420 may include increasing the transition time value by Δt if $R_{PRG}$ is greater than $R_{TAR}$. The transition time value may have an initial value corresponding to transition time value $T_1$, $T_2$, and $T_3$ based on a table such as table 320 of FIG. 32 The Δt may have an initial value selected in ways similar to or identical to those described above with reference to FIG. 28

Activity 3406 may conditionally modify Δt such that Δt used in activity 3410 or 3420 may remain at the same value (e.g., a value equal to a previous value of Δt such as the initial value of Δi) or may vary, depending on the various values of $R_{PRG}$. During the programming operation, $R_{PRG}$ may have one or more values that are outside the $R_{TAR}$ range and less than $R_{TAR}$ (e.g., value similar to $R_{PRG\_A}$, $R_{PRG\_B}$, or $R_{PRG\_C}$ of FIG. 28) and one or more other values that are outside the $R_{TAR}$ range and greater than $R_{TAR}$ (e.g., value similar to $R_{PRG\_D}$ or $R_{PRG\_E}$ of FIG. 28). Methods 3400 may store the values of $R_{PRG}$ during the programming operation to allow activity 3406 to conditionally modify Δt based on the stored values of $R_{PRG}$, as described below.

Activity 3406 may keep at the same value (e.g., a value equal to the initial value of Δi) if at any time during the programming operation all of the values of $R_{PRG}$ are outside the $R_{TAR}$ range and less than $R_{TAR}$.

Activity 3406 may also keep at the same value (e.g., a value equal to the initial value of Δi) if at any time during the programming operation all of the values of $R_{PRG}$ are outside the $R_{TAR}$ range and greater than $R_{TAR}$.

Activity 3406 may modify Δt (e.g., increase Δt) if at any time during the programming operation at least one value of $R_{PRG}$ (e.g., value similar to $R_{PRG\_A}$, $R_{PRG\_B}$, or $R_{PRG\_C}$ of FIG. 28) is outside the $R_{TAR}$ range and less than $R_{TAR}$, and at least one value of $R_{PRG}$ (e.g., value similar to $R_{PRG\_D}$ or $R_{PRG\_E}$ of FIG. 28) is outside the $R_{TAR}$ range and greater than $R_{TAR}$.

Based on the comparison in activity 3405 and the conditional modification of Δt in activity 3406, activity 3410 may decrease the transition time value (used for the next programming sequence) by the same initial value of Δt if at any time during the programming operation all of the values of $R_{PRG}$ are less than $R_{TAR}$. Activity 3410 may decrease the transition time value by a modified value of Δt if at any time during the programming operation at least one value of $R_{PRG}$ is less than $R_{TAR}$, and at least one value of $R_{PRG}$ is greater than $R_{TAR}$.

Based on the comparison in activity 3405 and the conditional modification of Δt in activity 3406, activity 3420 may increase the transition time value (used for the next programming sequence) by the same initial value of Δt if at any time during the programming operation all of the values of $R_{PRG}$ are greater than $R_{TAR}$. Activity 3420 may increase the transition time value by a modified value of Δt if at any time during the programming operation at least one value of $R_{PRG}$ is less than $R_{TAR}$, and at least one value of $R_{PRG}$ is greater than $R_{TAR}$.

Methods 3400 may modify Δt in ways similar to or identical to those by which methods 3300 of FIG. 33 modifies Δi. For example, methods 3400 may modify Δt by reducing it by a factor of ($\frac{1}{2}^n$), where "n" is a real number, in which methods 3400 may increase "n" by a non-integer value or by an integer value each time activity 3406 modifies Δt.

Activity 3406 may modify Δt using slope calculations described above with reference to FIG. 24 and FIG. 25 but with Δt replacing Δi1, Δi2, or Δi3 in the slope calculations. When modifying Δt using slope calculations, activity 3406 may use a curve similar to curve 2400 of FIG. 24 to calculate the slope but with a time axis replacing the current axis in FIG. 24 so that the curve used in the slope calculation may represent the relationship between resistance and transition time (similar to the relationship between resistance and transition time of curve 2800 of FIG. 28).

Methods 3400 may repeat activities 3488 and 3499 until $R_{PRG}$ is within the $R_{TAR}$ range.

The memory cell used in the programming operations and methods 3000, 3300, and 3400 described herein may include memory cell 600 or 1100 (FIG. 6 through FIG. 9 and FIG. 11 through FIG. 14). The programming operations described herein may allow a memory cell (e.g., memory cell 600 or 1100) to be configured with a relatively greater margin for current values along the current axis, such as the current axis of FIG. 20, or allow a relatively greater margin for transition time values along the time axis, such as the time axis of FIG. 26. A greater margin of current or transition time value may allow improved programming, more logic states to be stored in a memory cell, and/or tighter resistance distribution among the memory cells. Thus, higher bit density per memory cell may be achieved. The programming operations described herein may also improve data retention and device reliability. Further, the programming operations described herein may allow a relatively faster convergence to a target resistance value and/or relatively more consistent programmed resistance values, thereby device performance (e.g., programming speed) may also be improved.

The illustrations of the apparatus (e.g., memory devices 101 and 201, and memory cells 100, 200, 300, 400, 500, 600, and 1100) are intended to provide a general understanding of the structure of various embodiments and are not intended to provide a complete description of all the elements and features of the apparatus and systems that might make use of the operations and structures described herein.

Any of the features described above can be implemented in a number of ways, including simulation via software. Thus, the apparatus (e.g., a portion of memory device 101 or the entire memory device 101, and portion of memory device 201 or the entire memory device 201) described above may be characterized as "modules" (or "module") herein. Such modules may include hardware circuitry, single and/or multi-processor circuits, memory circuits, software program modules and objects and/or firmware, and combinations thereof, as desired by the architect of the apparatus (e.g., memory devices 101 and 201), and as appropriate for particular implementations of various embodiments. For example, such modules may be included in a system operation simulation package, such as a software electrical signal simulation package, a power usage and distribution simulation package, a capacitance-inductance simulation package, a power/heat dissipation simulation package, a signal transmission-reception simulation package, and/or a combination of software and hardware used to operate or simulate the operation of various potential embodiments.

The methods and apparatus of various embodiments may include or be included in electronic circuitry used in high-speed computers, communication and signal processing circuitry, single or multi-processor modules, single or multiple embedded processors, multi-core processors, data switches, and application-specific modules including multilayer, multi-chip modules. Such methods and apparatus may further be included as sub-components within a variety of electronic systems, such as televisions, cellular telephones, personal computers (e.g., laptop computers, desktop computers, hand-held computers, tablet computers, etc.), workstations, radios, video players, audio players (e.g., MP3 (Motion Picture Experts Group, Audio Layer 3) players), vehicles, medical devices (e.g., heart monitor, blood pressure monitor, etc.), set top boxes, and others.

One or more embodiments described herein include methods and apparatus having a module configured to program the memory cell using a signal to cause the memory cell to have a programmed resistance value, to adjust a programming parameter value of the signal if the programmed resistance value is outside a target resistance value range, and to repeat at least one of the programming and the adjusting if the programmed resistance value is outside the target resistance value range, the signal including a different programming parameter value each time the programming is repeated. Other embodiments, including additional apparatus and methods, are described above with reference to FIG. 1 through FIG. 34.

The above description and the drawings illustrate some embodiments of the invention to enable those skilled in the art to practice the embodiments of the invention. Other embodiments may incorporate structural, logical, electrical, process, and other changes. In the drawings, like features or like numerals describe substantially similar features throughout the several views. Examples merely typify possible variations. Portions and features of some embodiments may be included in, or substituted for, those of others. Many other embodiments will be apparent to those of skill in the art upon reading and understanding the above description. Therefore, the scope of various embodiments of the invention is checked by the appended claims, along with the full range of equivalents to which such claims are entitled.

The Abstract is provided to comply with 37 C.F.R. §1.72(b) requiring an abstract that will allow the reader to quickly ascertain the nature and gist of the technical disclosure. The Abstract is submitted with the understanding that it will not be used to interpret or limit the scope or meaning of the claims.

What is claimed is:

1. A method comprising:
   programming a memory cell using a signal to cause the memory cell to have a programmed resistance value;
   adjusting a programming parameter value if the programmed resistance value is outside a target resistance value range;
   repeating at least one of the programming or the adjusting when the programmed resistance value is outside the target resistance value range, wherein the signal includes a different programming parameter value each time the programming is repeated;
   sensing the memory cell before programming the memory cell to obtain a resistance value of the memory cell; and
   skipping the programming when the resistance value is within the target resistance value range.

2. The method of claim 1, wherein the programming parameter value includes an amplitude value, and wherein adjusting includes performing one of increasing or decreasing the amplitude value by an amplitude amount, and wherein the amplitude amount is a variable amount.

3. The method of claim 1, wherein the programming parameter value includes a transition time value, and wherein adjusting includes performing one of increasing or decreasing the transition time value by a time amount, and wherein the time amount is a variable amount.

4. A method comprising:
   programming a memory cell using a signal to cause the memory cell to have a programmed resistance value;
   adjusting a programming parameter value if the programmed resistance value is outside a target resistance value range;
   repeating at least one of the programming or the adjusting when the programmed resistance value is outside the target resistance value range, wherein the signal includes a different programming parameter value each time the programming is repeated; and
   using a plurality of signals with a plurality of initial target amplitude values to program at least one selected memory cell to obtain a plurality of initial target resistance values, the plurality of signals having different amplitude values, the plurality of initial target resistance values having different resistance values, wherein the at least one selected memory cell is programmed before programming the memory cell using the signal, wherein the target resistance value range includes one of the plurality of initial target resistance values, and wherein the amplitude value of the signal before the adjusting includes one of the plurality of initial amplitude values.

5. The method of claim 4, wherein adjusting the programming parameter value includes adjusting the amplitude value of the signal.

6. A method comprising:
   programming a memory cell using a signal to cause the memory cell to have a programmed resistance value;
   adjusting a programming parameter value if the programmed resistance value is outside a target resistance value range;
   repeating at least one of the programming or the adjusting if the programmed resistance value is outside the target resistance value range, wherein the signal includes a different programming parameter value each time the programming is repeated; and
   using a plurality of signals with a plurality of initial target transition time values to program at least one selected memory cell to obtain a plurality of initial target resistance values, the plurality of signals having different transition time values, the plurality of initial target resistance values having different resistance values, wherein the at least one selected memory cell is programmed before programming the memory cell using the signal, wherein the target resistance value range includes one of the plurality of initial target resistance values, and wherein the transition time value of the signal before the adjusting includes one of the plurality of initial transition time values.

7. The method of claim 6, wherein adjusting the programming parameter value includes adjusting the transition time value of the signal.

8. An apparatus comprising:
   a non-volatile memory cell; and
   a module configured to program the memory cell using a signal to cause the memory cell to have a programmed resistance value, to adjust a programming parameter value including a current value of the signal when the programmed resistance value is outside a target resistance value range, and to repeat at least one of the programming or the adjusting if the programmed resistance value is outside the target resistance value range, wherein the signal includes a different programming parameter value each time the programming is repeated, and wherein the module is configured to adjust the current value based on a function of a slope of a resistance versus current curve of the memory cell and a difference between a target resistance value and the programmed resistance value, the target resistance value being a value within the target resistance value range.

9. The apparatus of claim 8 further comprising a storage area configured to store a relationship between a plurality of target resistance values and a plurality of current values, wherein the module is configured to select one of the plurality of current values to be the current value of the signal before the current value of the signal is adjusted.

10. The apparatus of claim 8, wherein the non-volatile memory cell includes:
   a first electrode and a second electrode; and
   a memory element directly contacting the first and second electrodes, wherein the memory element includes a programmable portion having a material configured to change between multiple phases, wherein the programmable portion is isolated from the first electrode by a first portion of the memory element, and wherein the programmable portion is isolated from the second electrode by a second portion of the memory element.

11. The apparatus of claim 10, wherein the material of the memory element includes a compound of germanium (Ge), antimony (Sb), and tellurium (Te).

12. An apparatus comprising:
   a non-volatile memory cell; and
   a module configured to program the memory cell using a signal to cause the memory cell to have a programmed resistance value, to adjust a programming parameter value of the signal when the programmed resistance value is outside a target resistance value range, and to repeat at least one of the programming or the adjusting if the programmed resistance value is outside the target resistance value range, wherein the signal includes a different programming parameter value each time the programming is repeated, and wherein the module is configured to sense the memory cell before programming the memory cell for obtaining a resistance value of the memory cell and to skip the programming when the resistance value is within the target resistance value range.

* * * * *